United States Patent
Kim

(10) Patent No.: US 8,604,814 B2
(45) Date of Patent: Dec. 10, 2013

(54) TESTER AND TEST APPARATUS INCLUDING THE SAME

(75) Inventor: Yang-gi Kim, Hwaseong-si (KR)

(73) Assignee: Samsung Electronics Co., Ltd., Samsung-ro, Yeongtong-gu, Suwon-si Gyeonggi-do (KR)

( * ) Notice: Subject to any disclaimer, the term of this patent is extended or adjusted under 35 U.S.C. 154(b) by 265 days.

(21) Appl. No.: 13/239,352

(22) Filed: Sep. 21, 2011

(65) Prior Publication Data

US 2012/0139572 A1    Jun. 7, 2012

(30) Foreign Application Priority Data

Dec. 3, 2010   (KR) .................. 10-2010-0122677

(51) Int. Cl.
*G01R 31/20* (2006.01)
*H01L 21/66* (2006.01)

(52) U.S. Cl.
USPC ....................... 324/754.07; 438/18

(58) Field of Classification Search
None
See application file for complete search history.

(56) References Cited

U.S. PATENT DOCUMENTS 8,212,579 B2 *   7/2012   Abe et al. ................. 324/754.11

FOREIGN PATENT DOCUMENTS

| JP | 05-121498 | 5/1993 |
| JP | 07-169803 | 7/1995 |
| JP | 2009-060037 | 3/2009 |
| KR | 1020080012538 | 2/2008 |

* cited by examiner

*Primary Examiner* — Jermele M Hollington
*Assistant Examiner* — Trung Nguyen
(74) *Attorney, Agent, or Firm* — Muir Patent Consulting, PLLC

(57) ABSTRACT

A tester may include a test head with a movable coupler, a probe card with a connector unit that is coupled with the coupler, and a needle block disposed on the probe card. In one example, the tester may test respective subsets of semiconductor devices on a wafer via a one-touch operation by moving a coupler on the test head, while the wafer remains in continuous and uninterrupted electrical contact with the tester during testing.

20 Claims, 14 Drawing Sheets

TESTER AND TEST APPARATUS INCLUDING THE SAME

CROSS-REFERENCE TO RELATED APPLICATIONS

This application claims the benefit of Korean Patent Application No. 10-2010-0122677, filed on Dec. 3, 2010, in the Korean Intellectual Property Office, the disclosure of which is incorporated herein in its entirety by reference.

BACKGROUND

A semiconductor device test apparatus, and more particularly, a semiconductor device test apparatus including a movable test interface, which may perform a test via a one-touch operation, is disclosed herein.

In general, a semiconductor manufacturing process may include a fabrication process of forming a plurality of semiconductor devices on a wafer, an electric die sorting (EDS) process of testing the electrical properties of the respective devices formed on the wafer, and an assembly process of separating good devices determined by the EDS process into discrete devices and packaging the devices to protect the devices from external mechanical, physical, and chemical shocks.

Among these processes, the EDS process may be a process for determining whether the devices formed on the wafer are good or defective. The EDS process may include transmitting an electric signal to each of the devices formed on the wafer and determining whether the devices are good or defective based on an output signal corresponding to the transmitted electric signal.

Since each of the devices formed on the wafer has a very small size, directly connecting a tester configured to generate the electric signal to each of the devices may be very difficult. Accordingly, a probe card, including a plurality of probe needles, may be used as an intermediate medium between the tester configured to generate the electric signal and the wafer on which the devices are formed.

The tester may generate the electric signal used for testing a chip and transmit that electric signal to the probe card. The probe card may transmit the electric signal to each of the devices through the probe needles.

SUMMARY

In one embodiment, a semiconductor device tester includes a movable test interface that may perform a test on a plurality of semiconductor devices using a wafer as a substrate via a one-touch operation.

In one embodiment, a method for manufacturing a semiconductor device comprising the steps of forming a plurality of semiconductor devices using a wafer as a substrate, each of the plurality of semiconductor devices including pads in electrical communication with integrated circuitry of the semiconductor devices; contacting a plurality of probe needles disposed on a probe card to corresponding pads of the semiconductor devices; connecting each of a plurality of tester electrical connectors disposed on a tester to a first set of probe card electrical connectors disposed on the probe card; testing a first group of semiconductor devices connected to a first set of probe needles that are in electrical communication with the first set of probe card electrical connectors; disconnecting the plurality of tester electrical connectors from the first set of probe card electrical connectors; while the plurality of probe needles remain in contact with the corresponding pads of the semiconductor devices, connecting the plurality of tester electrical connectors to a second set of probe card electrical connectors; testing a second group of semiconductor devices connected to a second set of probe needles that are in electrical communication with the second set of probe card electrical connectors; and disconnecting the wafer from the plurality of probe needles.

In one embodiment, a semiconductor device tester includes a prober that comprises a plurality of probes and a plurality of prober connectors, with each of the prober connectors being in electrical communication with one or more probes, and the plurality of probes being configured to contact corresponding pads of a plurality of semiconductor devices, with the plurality of semiconductor devices using a wafer as a substrate. The tester also includes a test head that comprises a plurality of tester connectors and a coupling device configured to connect the plurality of tester connectors with a first subset of the plurality of prober connectors, the coupling device being configured to disconnect the plurality of tester connectors from the first subset of the plurality of prober connectors and to connect the plurality of tester connectors to a second subset of the plurality of prober connectors. The tester also includes a test main body configured to test, via electrical communication with the tester connectors, a first subset of the semiconductor devices at a first time via the first subset of prober connectors and a second subset of the semiconductor devices at a second time via the second subset of prober connectors.

In another embodiment, a semiconductor wafer testing system includes a probing card that comprises a plurality of probing needles and a plurality of probing card connectors, each of the probing card connectors being in electrical communication with one or more probing needles, and the plurality of probing needles being configured to contact corresponding pads of a plurality of semiconductor devices, with the plurality of semiconductor devices using a wafer as a substrate. The testing system also includes a plurality of test connectors and a zero-insertion force (ZIF) ring configured to connect the plurality of test connectors with a first subset of the plurality of probing card connectors, the ZIF ring being configured to disconnect the plurality of test connectors from the first subset of probing card connectors and to connect the plurality of test connectors to a second subset of the plurality of probing card connectors. The testing system also includes a test main body configured to test, via electrical communication with the test connectors, a first subset of the semiconductor devices at a first time via the first subset of probing card connectors and a second subset of the semiconductor devices at a second time via a second subset of probing card connectors.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION OF THE EMBODIMENTS

Figure 1:
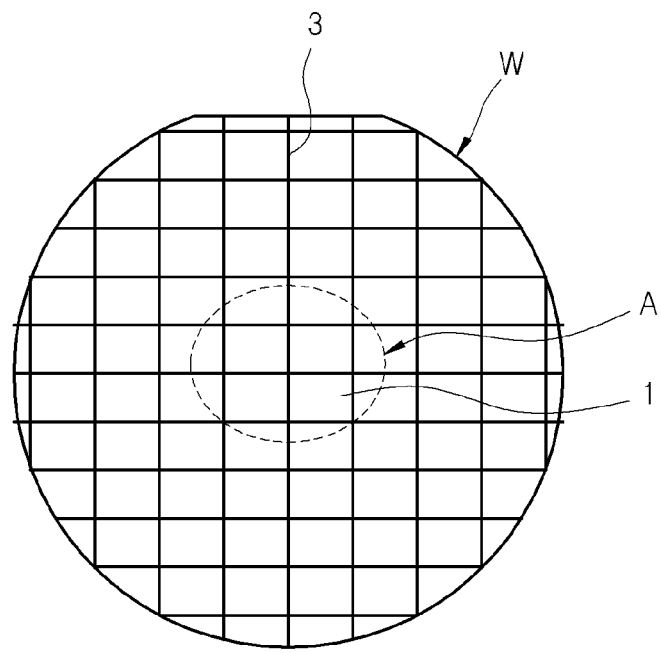
FIG. 1 is a plan view of a wafer on which semiconductor devices are formed.

The present disclosure will be described more fully hereinafter with reference to the accompanying drawings, in which various embodiments are shown. The invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element or layer is referred to as being "on", "connected to", or "coupled to" another element or layer, it can be directly on, connected or coupled to the other element or layer or intervening elements or layers may be present. In contrast, when an element is referred to as being "directly connected" or "directly coupled" to another element, there are no intervening elements present. As used herein, the term "and/or" includes any and all combinations of one or more of the associated listed items and may be abbreviated "/".

It will be understood that, although the terms first, second, etc., may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an", and "the" should not exclude the plural forms as well, unless the context clearly indicates otherwise. It will be further understood that the terms "comprises" and/or "comprising" or "includes" and/or "including" when used in this specification, specify the presence of stated features, regions, integers, steps, operations, elements and/or components, but do not preclude the presence of addition of one or more other features, regions, integers, steps, operations, elements, components and/or groups thereof.

Embodiments described herein will be described referring to plan views and/or cross-sectional views by way of ideal schematic views. Accordingly, the exemplar views may be modified depending on manufacturing technologies and/or tolerances. Therefore, the disclosed embodiments are not limited to those shown in the views, but include modifications in configuration formed on the basis of the manufacturing processes.

Spatially relative terms, such as "beneath", "below", "lower", "above", "upper" and the like, may be used herein for ease of description to describe one element's or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features should still be considered to have such an orientation. Thus, the term "below" can encompass both an orientation of above and below. The device may be otherwise oriented (rotated 90 degrees or at other orientations) and the locational descriptors used herein interpreted in the same manner.

Terms such as "same", "planar", or "coplanar", as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes amounts, or other measures within acceptable variations that may occur, for example, due to manufacturing processes.

Unless otherwise defines, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art/or or the present application, and should not be interpreted in an idealized or overly formal sense unless expressly defined so herein.

Figure 2:
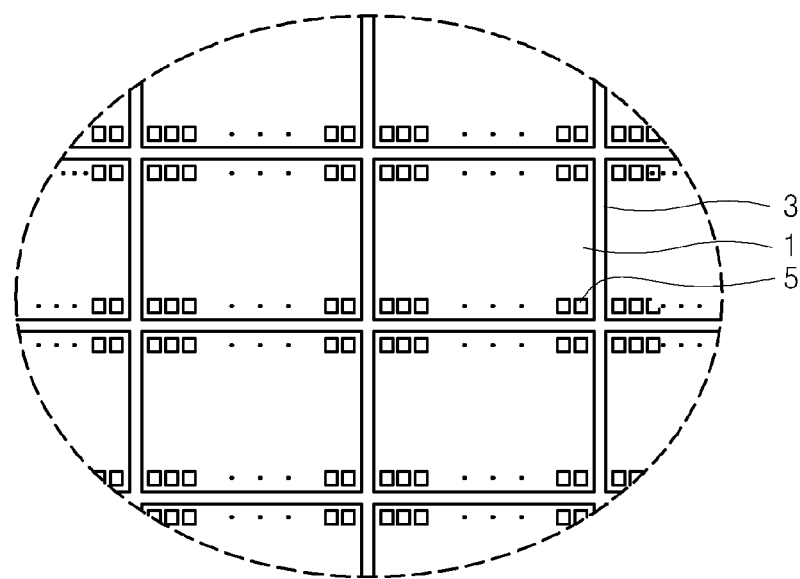
FIG. 2 is an enlarged plan view of a portion A of FIG. 1.

FIG. 1 is a plan view of a wafer W on which semiconductor devices 1 are formed, and FIG. 2 is an enlarged plan view of a portion A of FIG. 1.

Referring to FIGS. 1 and 2, the semiconductor devices 1 may be disposed on the wafer W using a fabrication process. The semiconductor devices 1 may be separated from one another by scribe lines 3 to fabricate discrete unit chips using an assembly process. A scribe line may encompass an area between two semiconductor devices formed on a wafer that does not contain any circuitry, to allow two semiconductor devices may be separated from each other without damage to integrated circuitry within the two semiconductor devices (e.g., allow for cutting via saw or laser along the scribe line). Scribe lines may be used to separate each semiconductor device from the neighboring semiconductor devices on the wafer. Some processes may separate the semiconductor devices from the wafer by cutting or breaking the wafer on its scribe lines. However, in some alternative embodiments, some or all of the semiconductor devices are not separated from each other on a wafer (even with the existence of a scribe line between these semiconductor devices). Further, some embodiments contemplate use of the scribe line for electrical connections, such as connections between neighboring semiconductor devices, or for providing through substrate vias (TSVs) to allow electrical connections between stacked semiconductor devices and/or package substrates.

An electric die sorting (EDS) process of testing the electrical properties of the semiconductor devices 1 formed on the wafer W may be performed between the fabrication process and the assembly process. The EDS process may include applying electric signals to electrode pads 5 (e.g. chip pads) provided along peripheral portions of the semiconductor devices 1 disposed on the wafer W and determining whether the semiconductor devices 1 are defective in response to output signals corresponding to the applied electric signals. Alternatively or in addition, other testing processes may be used to test the electrical properties of the semiconductor devices 1 formed on the wafer W by similar application of electric signals to the electrode pads 5 and analysis of the resultant output signals.

A test apparatus 1000 may be employed to perform an electric test on the semiconductor devices 1 disposed on the wafer W. The test apparatus 1000 may include a test head and a probe card to apply electric signals to the electrode pads 5 of the semiconductor devices 1. Hereinafter, a test apparatus 1000 according to an exemplary embodiment is described in detail.

Figure 3:
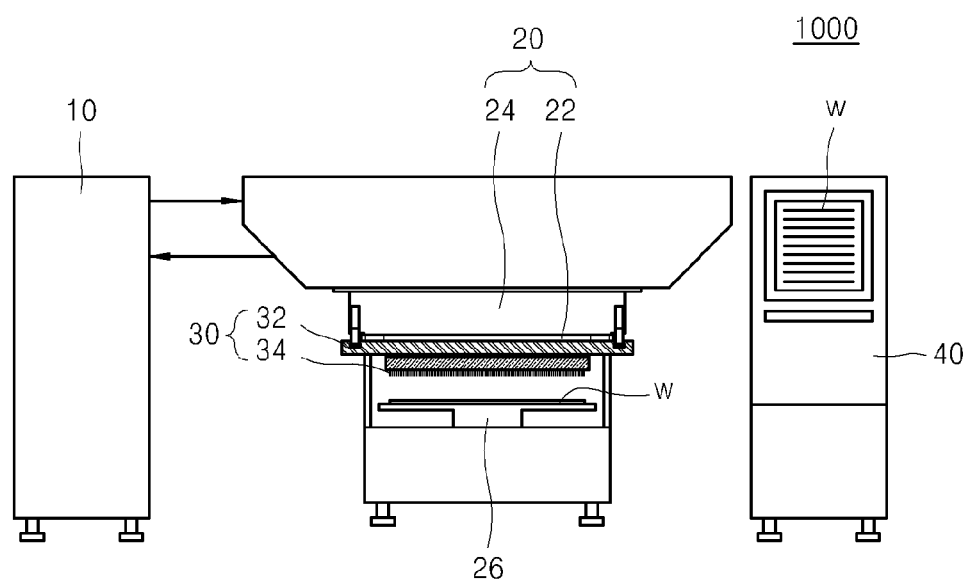
FIG. 3 is a block diagram of a test apparatus according to an exemplary embodiment.

FIG. 3 is a block diagram of a test apparatus 1000 according to an exemplary embodiment.

Referring to FIG. 3, the test apparatus 1000 may include a test main body 10, which is configured to transmit, receive and analyze electric signals. The test apparatus 1000 may also include a test head 20 that includes a plurality of tester electrical connectors 22 and a coupling device 24 and a wafer support plate 26. The tester electrical connectors 22 are disposed on the bottom of the coupling device 24. The test main body 10 and the test head 20 may be electrically connected to each other by an electric wire.

The test apparatus 1000 may also include a probe card 30 that includes a plurality of probe electrical connectors 32 and a plurality of probe needles 34. A number of signal channels (not shown) exist between the probe card electrical connectors 32 and the probe needles 34. Each signal channel carries a signal from the probe card electrical connectors 32 to a set of the connected probe needles 34. The ratio of the number of probe card electrical connectors 32 to the number of tester electrical connectors 22 is based on the number of signal channels from the probe card electrical connectors 32 to the probe needles 34. The test apparatus may also include a wafer chamber 40 that holds the wafers that are then tested by the test apparatus 1000.

The test apparatus 1000 may conduct a one-touch operation to test all of the semiconductor devices formed on a wafer. A wafer W may be placed on the wafer support plate 40. The wafer may be similar to the wafer depicted in FIGS. 1 and 2. The wafer support plate 40 may move the wafer in an upward or downward manner to connect or disconnect the wafer from the probe needles 34 of the probe card 30.

When the wafer is connected to the probe card 30, the probe needles 34 of the probe card 30 may connect to each of the semiconductor devices on the wafer. In one embodiment, each of the semiconductor devices includes a plurality of electrode pads (e.g. chip pads), and the probe needles 34 connect to the electrode pads of the semiconductor devices. Thus, the test main body 10 may send and receive electrical signals via the probe card to the semiconductor devices through a signal channel, when the probe needles are connected to the semiconductor devices.

In one embodiment, testing of a wafer begins when the test main body 10 may generate an electric signal for testing the semiconductor devices and transmit the electric signal through the test head 20 and the probe card 30 via one of the signal channels to each of the semiconductor devices of the wafer W connected to probe needles 32 that are connected to that signal channel. Also, the test main body 10 may receive a signal in response to the transmitted electric signal through the probe card 30 and the test head 20. The test main body 10 may use the received signal to determine whether each of the semiconductor devices is good or defective. The tester may be configured to test all of the semiconductor devices to a single signal channel in parallel. The test main body 10 may continue to send and receive signals in this manner via all of the signal channels until each of the semiconductor devices on the wafer have been tested. When the test main body 10 has determined whether each of the semiconductor devices on the wafer is good or defective, the testing of that wafer may be ended.

The wafer chamber 40 may be a space in which one or more wafers W to be tested are stored. To perform a test, the one or more wafers W stored in the wafer chamber 40 may be transferred one by one to the wafer support plate 26 of the test head 20 by a transfer unit (not shown).

Figure 4A:
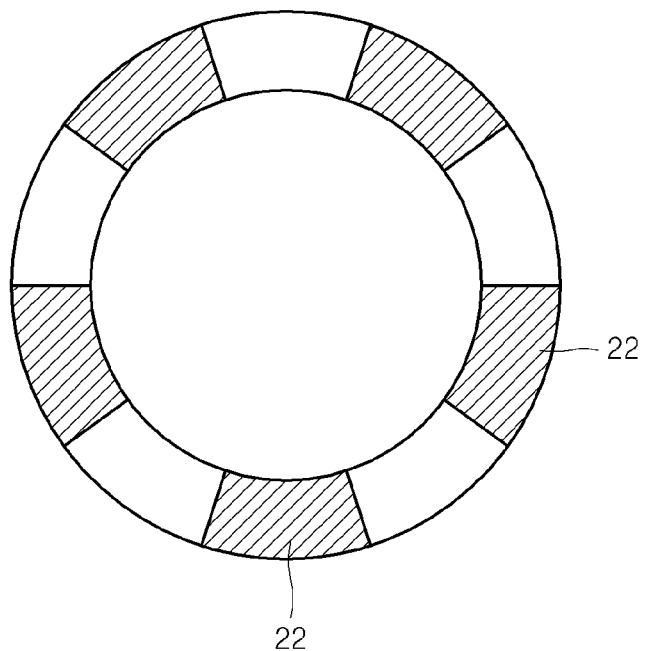
FIGS. 4(a) and (c) are top views of a test head according to an exemplary embodiments.

FIGS. 4(a) and (c) are top views of a coupling device 24 to show various embodiments depicting exemplary arrangements of tester electrical connectors 22 thereon. In FIGS. 4(a) and (c), the shaded components represent the tester electrical connectors 22. In one embodiment as shown in FIG. 4(a), the tester electrical connectors 22 of the test head 20 are positioned at equally spaced intervals on the periphery of the coupling device 24. In one embodiment as shown in FIG. 4(c), the tester electrical connectors 22 are equally spaced in rows and columns on the coupling device 24. The position, spacing and number of electrical tester connectors 22 is not limited to the embodiments depicted herein; rather, the position, spacing, and number of electrical tester connectors 22 may be in any position, spacing, and in any number suitable for use in the test apparatus 1000.

Figure 4B:
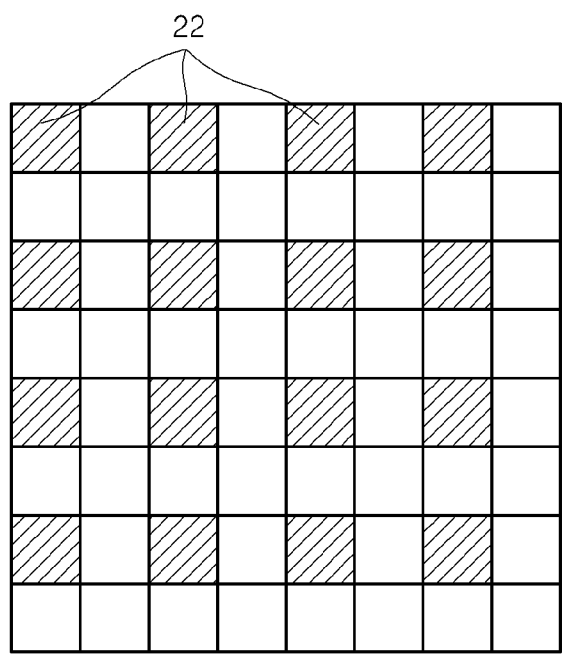
FIGS. 4(b) and (d) are top views of a probe card according to exemplary embodiments.
Figure 4C:
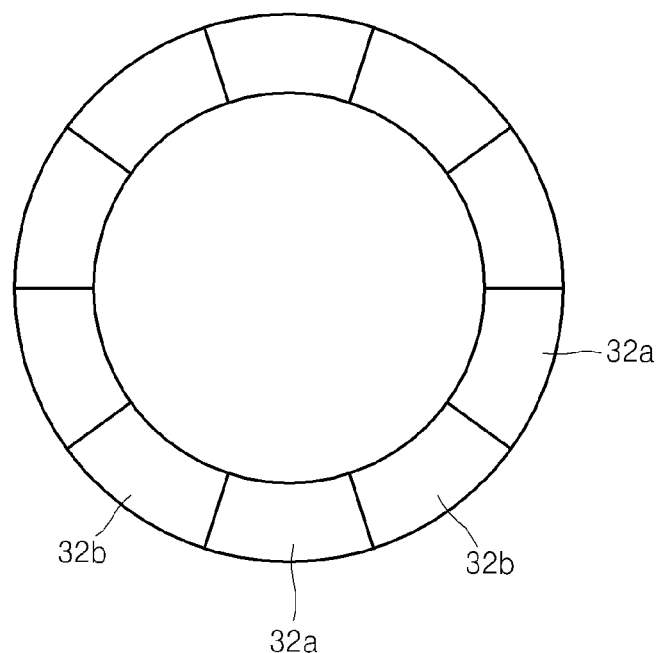

FIGS. 4(b) and (d) are top views of a probe card 30 to show various embodiments depicting exemplary arrangements of the probe card electrical connectors 32 thereon.

Referring to FIG. 4(b), the probe card 30 is one that would be used in association with the embodiment of the coupling device 24 depicted of FIG. 4(a). Thus, the probe card electrical connectors 32 correspond in position, spacing, and number to the tester electrical connectors 22 of the coupling device 24 shown in FIG. 4(a). In this embodiment, there are two signal channels from the probe card electrical connectors 32 to the probe needles 34. Thus, there are twice as many probe card electrical connectors 32 as tester electrical connectors 22. When a wafer is connected to the probe needles 34, testing of all of the semiconductor devices on the wafer using a one-touch operation may be accomplished by a test apparatus using the test head 20 of FIG. 2(a) and the probe card of FIG. 2(c).

In this embodiment, the wafer may be connected to the probe card 30 such that each of the semiconductor devices on the wafer is electrically and physically connected to at least one of the probe needles 34 of the probe card 30. The test head 20 may also include a movement mechanism (not shown) in the coupling device 24 that may move the coupling device 24 upward or downward to connect to the probe card 30. When the coupling device 24 connects to the probe card 30, the tester electrical connectors 22 physically and electrically connect to a first set of the probe card electrical connectors 22 that are connected to a single signal channel. The movement mechanism may also move the tester electrical connectors 22 in a linear or rotational manner.

In some embodiments, a different movement mechanism may be used to move the coupling device 24 and the tester electrical connectors 22. The manner in which the movement mechanism moves the tester electrical connectors 22 is not limited to a linear movement or a rotational movement. The movement may be any movement suitable to align the tester electrical connectors 22 with each set of the probe card electrical connectors 32 (where a set of probe card electrical connectors 32 are those probe card electrical connectors 32 connected to a single signal channel).

Each time the tester electrical connectors 22 are coupled (physically and electrically connected) to a set of the probe card electrical connectors 32, the test main body 10 may test all of the semiconductor devices connected to the probe needles 34 on the same signal channel as the coupled probe card electrical connectors 32 by sending an electrical signal to those devices. After testing of the connected semiconductor devices, the tester electrical connectors 22 are de-coupled from the probe card electrical connectors 32 and moved in order to align the tester electrical connectors 22 with a second set of probe card electrical connectors 32 that are connected to the second signal channel. The tester electrical connectors 22 may then be coupled to the second set of probe card electrical connectors 32 for the testing of the semiconductor devices connected to the probe needles 34 and the coupled probe card electrical connectors 32 via the second signal channel.

This process is repeated for each signal channel that exists between the probe card electrical connectors 32 and the probe needles 34. During the de-coupling, movement, and re-coupling of the tester electrical connectors 22, the wafer and the probe card 30 remain physically and electrically connected, enabling a one-touch operation to test all of the semiconductor devices on the wafer.

In the embodiment depicted in FIGS. 4(a) and (c), the tester electrical connectors 22 and the probe card electrical connectors 32 would be coupled twice to test the semiconductor devices connected on each of the two signal channels between the probe card electrical connectors 32 and the probe needles 34. The movement of the tester electrical connectors 22 after the coupling of the tester electrical connectors 22 to the first subset of probe card connectors 32a may be a rotational movement in the rightward direction or the leftward direction or any other movement that would be suitable to connect the tester electrical connectors 22 to the second subset of the probe card electrical connectors 32b.

Figure 4D:
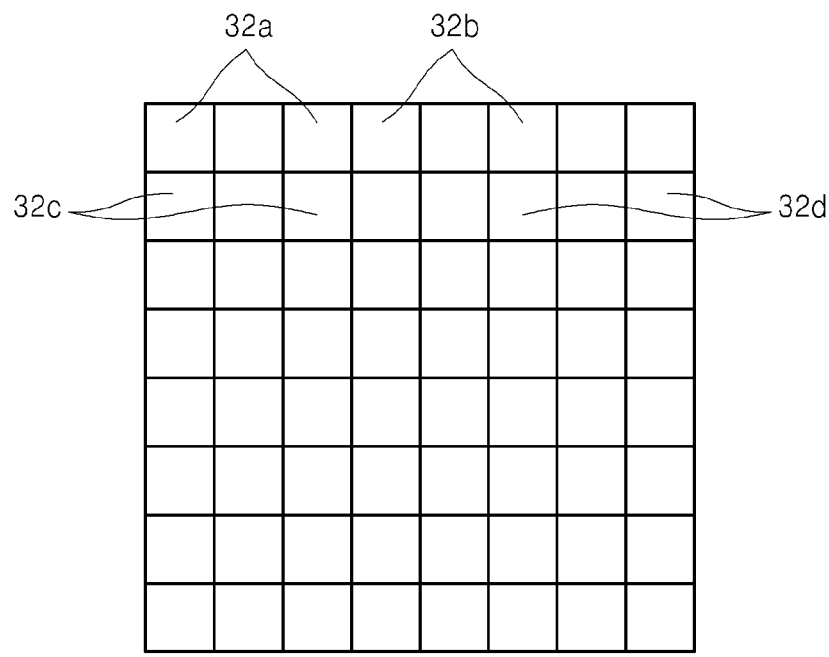

Referring to FIG. 4(d), the probe card 30 is one that would be used in association with the embodiment of the coupling device 24 depicted of FIG. 4(b). Thus, the probe card electrical connectors 32 correspond in position, spacing, and number to the tester electrical connectors 22 of the coupling device 24 shown in FIG. 4(b). The ratio of probe card electrical connectors 32 to tester electrical connectors 22 is related to the number of signal channels that exist between the probe card electrical connectors 32 and the tester electrical connectors 22. In this embodiment, there are four signal channels that connect the probe needles 34 to the probe card electrical connectors 32.

In order to conduct a one-touch operation to test all of the semiconductor devices of a wafer, the test apparatus may operate in a manner similar to that described in correlation with the embodiment set forth in FIGS. 4(a) and (c). With the embodiment depicted in FIGS. 4(b) and (d), however, there are four signal channels between the probe card electrical connectors 32 and the probe needles 34. Thus, the tester electrical connectors may be coupled four times to the probe card electrical connectors 32 in order to carry out the one-touch operation for testing all of the semiconductor devices on the wafer.

As mentioned above, the repeated coupling of the tester electrical connectors 22 and the probe card connectors 32 occurs by disconnecting the tester electrical connectors 22 from the first subset of probe card connectors 32a, moving the tester electrical connectors 22, and re-coupling the tester electrical connectors 22 and a second subset of probe card electrical connectors 32b. In this embodiment, the tester electrical connectors 22 may be moved in a linear fashion after the coupling of the tester electrical connectors 22 and a subset of probe card connectors 32 and the test of the corresponding connected semiconductor devices on the wafer. For example, the tester electrical connectors 22 may be moved a first time in a rightward direction linearly, then in a downward direction linearly, and then in a leftward direction linearly to couple with each subset of probe card connectors 32a, 32b, 32c, and 32d. The movement of the tester electrical connectors 22 is not limited to the movements described herein, but may be any movements suitable to connect the tester electrical connectors 22 to each subset of probe card connectors 32a, 32b, 32c, and 32d.

Figure 5:
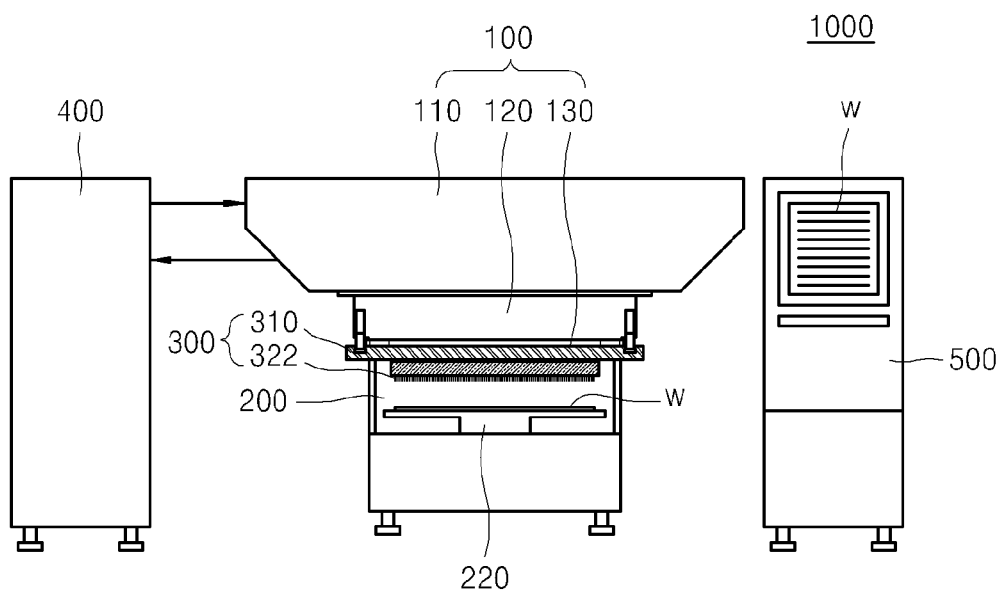
FIG. 5 is a schematic diagram of a test apparatus according to an exemplary embodiment.

FIG. 5 is a schematic diagram of a test apparatus 1000 according to an exemplary embodiment.

Referring to FIG. 5, the test apparatus 1000 may include a test head 100, a test chamber 200, a probe card 300, a test main body 400, and a loader chamber 500. The test main body 400 and the test head 100 may be electrically connected to each other by an electric wire.

The test head 100 may include a test head board 110, a base 120, and a zero insertion force (ZIF) ring 130. The ZIF ring 130 may be a type of zero insertion force coupler. A zero insertion force coupler may be configured to couple two elements such that the male and female connectors positioned on the two elements initially do not touch each other. Instead, the two elements are physically positioned together, with a mechanism that may move to mate all of the female and male connectors at once. The mechanism may include a lever, a slider, an actuating cam arrangement, or any other type of suitable mechanism. By engaging in such a process, a ZIF coupler uses much less force than other coupling methods because of the reduced need to bear down or apply pressure on the elements to couple them. An example of a zero insertion force coupler is found in U.S. Pat. No. 6,164,999 (Zero Insertion Force Socket and Method for Employing Same to Mount a Processing) to McCutchan et al. ("McCutchan patent"), which is herein incorporated in its entirety by reference. The ZIF socket and methods in the McCutchan patent are exemplary and do not limit the structure or use of any embodiments of the ZIF coupler herein.

A ZIF coupler may take numerous shapes. Although a ZIF ring is described in one embodiment, the ZIF coupler is not limited to a ring-shape. Rather, the ZIF coupler can take any shape suitable for use, including but not limited to a ring, a square, or a rectangle. In further alternative embodiments, a ZIF coupler may be replaced by one or more switches or other suitable mechanisms.

The test head board 110, which may constitute a main body of the test head 100, may have the form of a rectangular flat board and have inclined lateral surfaces so that a bottom surface of the test head board 110 has a smaller area than a top surface thereof. However, the shape of the test head board 110 is not limited thereto. For example, the test head board 110 may have the form of a typical rectangular or circular flat board having top and bottom surfaces with the same area.

The base 120 may be disposed on a bottom surface of the test head board 110 and have a ring shape with a hollow central portion. The probe card 300 may be coupled with a bottom surface of the base 120 through the ZIF ring 130. The base 120 may have various structures according to the shape of the probe card 300.

The ZIF ring 130 may be disposed on the bottom surface of the base 120 and enable ZIF-coupling of the probe card 300 with the base 120. In one embodiment, the ZIF ring 130 may be rotatable. The rotation of the ZIF ring 130 may facilitate a one-touch operation between the probe card 300 and the wafer W and test all the semiconductor devices disposed on the wafer W. In another embodiment, a ZIF coupler may be used in lieu of the ZIF ring 130. The ZIF coupler may be movable. The movements of the ZIF coupler may facilitate a one-touch operation between the probe card 300 and the wafer W and test all the semiconductor devices disposed on the wafer W.

The test head 100 is described in further detail below with reference to FIGS. 6 through 8.

The test chamber 200 may provide a space for testing the electric properties of semiconductor devices. A wafer support chuck 220 on and by which the wafer W is mounted and supported may be disposed within the test chamber 200. In the present embodiment, the wafer support chuck 220 may move the wafer W up and down while simply supporting the wafer W. That is, when the wafer W to be tested is located at a position corresponding thereto on the wafer support chuck 220, the wafer support chuck 220 may move the wafer W upward to touch probe needles 322 of the probe card 300, and move the tested wafer W downward.

Specifically, the probe card 300 may be placed on an upper opening of the test chamber 200 such that the probe needles 322 of the probe card 300 face downward, and the wafer W may be mounted on the wafer support chuck 220 opposite the probe card 300 inside the test chamber 200. When the wafer W is mounted on the wafer support chuck 220, electrode pads of a semiconductor device may be aligned in a direction in which the probe needles 322 of the probe card 300 are arranged. Thus, when the electrode pads of the semiconductor device are aligned with and under the probe needles 322 of the probe card 300 in a vertical direction, the wafer support chuck 220 may move in a straight line upward and downward so that the electrode pads of the semiconductor device of the wafer W physically and electrically contact with the probe needles 322 of the probe card 300.

Alternatively, the wafer support chuck 220 could remain motionless and the test head 100 (including the test head board 110, the base 120, and the ZIF ring 130) and the probe card 300 may move in a straight line upward and downward so that the electrode pads of the semiconductor device of wafer W physically and electrically contact with the probe needles 322 of the probe card 300. In another alternative, only the ZIF ring 130 and probe card 300 may move in a straight line upward and downward so that the electrode pads of the semiconductor device of wafer W physically and electrically contact with the probe needles 322 of the probe card 300 while the test head board 110 and the wafer support chuck 220 remain motionless.

A conventional test apparatus tests a wafer via not a one-touch operation but by using several touch operations. Specifically, the conventional test apparatus divides the wafer into several test regions. The conventional test apparatus tests a first test region via a one-touch operation and then tests another region via a subsequent one-touch operation. To completely test all of the regions of the wafer, numerous one-touch operations are needed. Testing the wafer via several touch operations involves indexing the corresponding semiconductor devices of the wafer using a channel driver of a probe card. Thus, the wafer support mechanism of a conventional test apparatus is configured to support the wafer and move the wafer forward, backward, rightward, or leftward and/or rotate the wafer. Alignment tests must be conducted to enable the wafer support mechanism of the conventional test apparatus to reliably connect the wafer with the probe card.

However, since the test apparatus 1000 according to the present embodiment is capable of testing the entire region of the wafer via a one-touch operation, indexing the wafer or complicatedly moving the wafer support chuck 220 is unnecessary. Thus, the test apparatus 1000 of the present embodiment may use a wafer support chuck 220 having a very simple structure, and the time taken to align a wafer may be greatly reduced. Obviously, a conventional wafer support mechanism may be employed in the test apparatus 1000 of the present embodiment.

In one embodiment, the probe card 300 may include a main circuit board 310 and the probe needles 322. The main circuit board 310 may have a disk shape, and a plurality of male or female connectors 352 may be formed on a top surface of the main circuit board 310 along a circumferential direction. The structure of the probe card 300 will be discussed in more detail below, with reference to FIGS. 9 and 10. By ZIF-coupling the male or female connectors 352 to the ZIF ring 130, the probe card 300 may be coupled with the base 120. Alternatively, in the embodiments in which a ZIF coupler is used in lieu of the ZIF ring 130, the connectors 352 may be formed on a top surface of the main circuit board 310 in any suitable pattern that corresponds with the pattern of the connectors 132 disposed on the ZIF coupler.

The probe needles 322 of the probe card 300 may physically and electrically contact with the electrode pads 5 of the semiconductor devices of the wafer W. The test main body 400 may generate an electric signal for testing the semiconductor devices and transmit the electric signal through the test head 100 and the probe card 300 to each of the semiconductor devices of the wafer W. Also, the test main body 400 may receive a signal in response to the transmitted electric signal through the probe card 300 and the test head 100. The test main body 400 may use the received signal to determine whether each of the semiconductor devices is good or defective.

The loader chamber 500 may be a space in which one or more wafers W to be tested are stored. To perform a test, the one or more wafers W stored in the loader chamber 500 may be transferred one by one to the wafer support chuck 220 of the test chamber 200 by a transfer unit (not shown).

Figure 6:
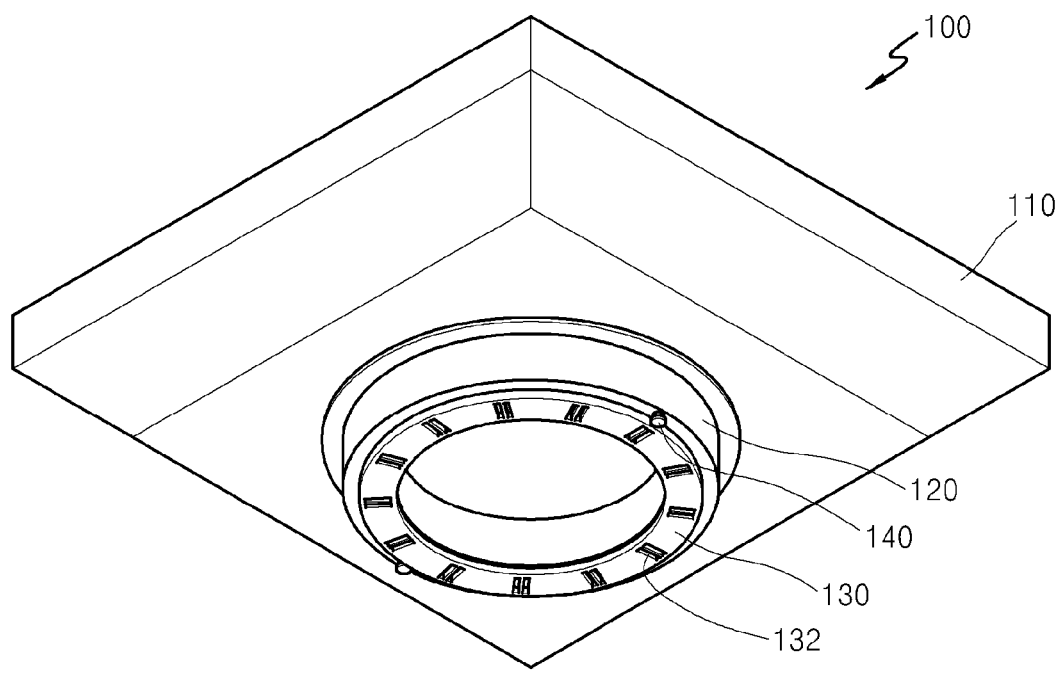
FIG. 6 is a detailed bottom perspective view of a test head of FIG. 3.

FIG. 6 is a detailed bottom perspective view of the test head 100 of FIG. 3.

Referring to FIG. 6, the test head 100 may include the test head board 110, the base 120, the ZIF ring 130, and a suspender 140.

An upper portion of the test head board 110 may have the form of a rectangular flat board, and a horizontal section of a lower portion of the test head board 110 may gradually taper because lateral surfaces of the test head board 110 are inclined at a predetermined angle. Obviously, the structure of the test head board 110 is not limited thereto.

The base 120 may be disposed on a bottom surface of the test head board 110 and coupled with the test head board 110. The base 120 may have a ring structure with a hollow center. Obviously, the base 120 may have various structures according to the structures of the probe card 300 coupled therewith and the ZIF ring 130, whose structure corresponds to the probe card 300.

The ZIF ring 130 may be coupled with the bottom surface of the base 120 and have a ring shape. As mentioned above, a ZIF coupler may be used in lieu of the ZIF ring 130. The shape of the ZIF coupler is not limited to a ring shape, and can take any shape suitable to correspond to the probe card and the wafer or regions of the wafer. A plurality of male and/or female connectors may be formed in the ZIF ring 130. In the present embodiment, pairs of female connectors 132 may be arranged in the ZIF ring 130 at predetermined intervals along a circumferential direction. Alternatively, in an embodiment in which a ZIF coupler is used in lieu of a ZIF ring, the female connectors may be arranged in any pattern that is suitable based on the shape of the ZIF coupler. The arrangement of the female connectors 132 is not limited to a circumferential pattern. For example, the female connectors 132 may be spaced apart in predetermined intervals around the periphery of the ZIF coupler or spaced evenly in several rows and/or columns on the ZIF coupler. Also, electrode terminals (not shown) may be internally formed in the female connectors 132 and electrically connected to the test main body 400 through interconnections disposed in the test head board 110 and the base 120.

In addition, when the female connectors 132 of the ZIF ring 130 are ZIF-coupled with male connectors 352 of the probe card 300, the electrode terminals of the female connectors may be electrically connected to electrode terminals of the male connectors.

Also, the ZIF ring 130 may be rotatable, and a rotation coupling unit (not shown) may be provided on the bottom surface of the base 120 to enable the rotation of the ZIF ring 130. Alternatively, in an embodiment where a ZIF coupler is used, the rotation coupling unit may be replaced by a movable coupling unit (not shown) that may move the ZIF coupler in a linear fashion. For example, the movable coupling unit may move the ZIF coupler horizontally and/or vertically over the wafer, coplanar to the wafer's surface. The rotation coupling unit is described below with reference to FIGS. 5 and 6. While the ZIF ring 130 is rotating, the female connectors of the ZIF ring 130 may be sequentially coupled with the male connectors of the probe card 300. The number of rotations of the ZIF ring 130 is dependent on the ratio of connectors on the ZIF ring 130 to connectors on the probe card 300. For example, when the probe card 300 has male connectors equal to three-fold the female connectors of the ZIF ring 130, the ZIF ring 130 may rotate twice by a predetermined angle so that all the male connectors of the probe card 300 can be coupled with the female connectors of the ZIF ring 130 once. Correspondingly, in an alternative embodiment where a ZIF coupler is used, the number of movements of the ZIF coupler is dependent on the ratio of connectors 132 on the ZIF coupler to the connectors 352 on the probe card 300.

While it is described above that the female connectors are formed in the ZIF ring 130 thus far, the male connectors can be formed in the ZIF ring 130 and female connectors can be formed in the probe card 300. Further, the present embodiments are not limited to male and female connectors; rather, connectors having various shapes capable of an electrical combination may be formed in the ZIF ring 130 and the probe card 300.

The suspender 140 may be disposed on a terminal of an outer portion of the bottom surface of the base 120. When the ZIF ring 130 is rotating, the suspender 140 may function to space the probe card 300 a predetermined distance apart from the ZIF ring 130. That is, after the female connectors 132 and a first subset of the male connectors 352 are connected and an electric signal is transmitted from the test main body 400 to the semiconductor devices on the wafer and a resultant signal is received by the test main body 400, the ZIF-coupling of the probe card 300 with the ZIF ring 130 may be released, and the probe card 300 may remain spaced a predetermined distance apart from the bottom surface of the base 120. Because there are more male connectors 352 on the probe card 300 than female connectors 132 on the ZIF ring 130, the ZIF ring 130 must be rotated in order for each subset of the male connectors 352 to connect to a female connector 132. As mentioned above, the ratio of male connectors 352 on the probe card 300 to female connectors 132 on the ZIF ring 130 determines how many rotations the ZIF ring 130 may undergo. Thus, the ZIF ring 130 may then rotate while being spaced apart from the probe card 300. After rotating, the probe card 300 may be coupled with the ZIF ring 130 such that the female connectors 132 and a second subset of the male connectors 352 are connected in order for the test main body 400 to transmit an electric signal to the semiconductor devices on the wafer and to receive a resultant signal. This process of coupling the ZIF ring 130 and the probe card 300 to send and receive a signal and then rotating the ZIF ring 130 will continue until the female connectors 132 of the ZIF ring 130 have connected with all of the subsets of the male connectors 352 of the probe card 300.

The suspender 140 may serve to ZIF-couple the probe card 300 with the ZIF ring 130 when the test main body 400 performs a test by sending an electric signal via the ZIF ring 130 and coupled probe card connectors 352 to the connected semiconductor devices. The suspender 140 may also serve to couple the probe card 300 apart from the ZIF ring 130 during the rotation of the ZIF ring 130 such that the probe card 300 remains spaced a predetermined distance apart from the bottom surface of the base 120. Alternatively, the suspender 140 may release the ZIF ring 130 and the probe card 300 from coupling to maintain the predetermined distance between the probe card 300 and the base 120 while the ZIF ring 130 rotates. Although the suspender 140 may be disposed on the bottom surface of the base 120 as in the present embodiment, the position of the suspender 140 is not limited thereto and the suspender 140 may be disposed anywhere on the base 120 as long as the suspender 140 may serve the above-described function. For example, the suspender 140 may be formed on a lateral surface of the base 120 or in the hollow center of the base 120 as shown in FIG. 8.

Figure 7:
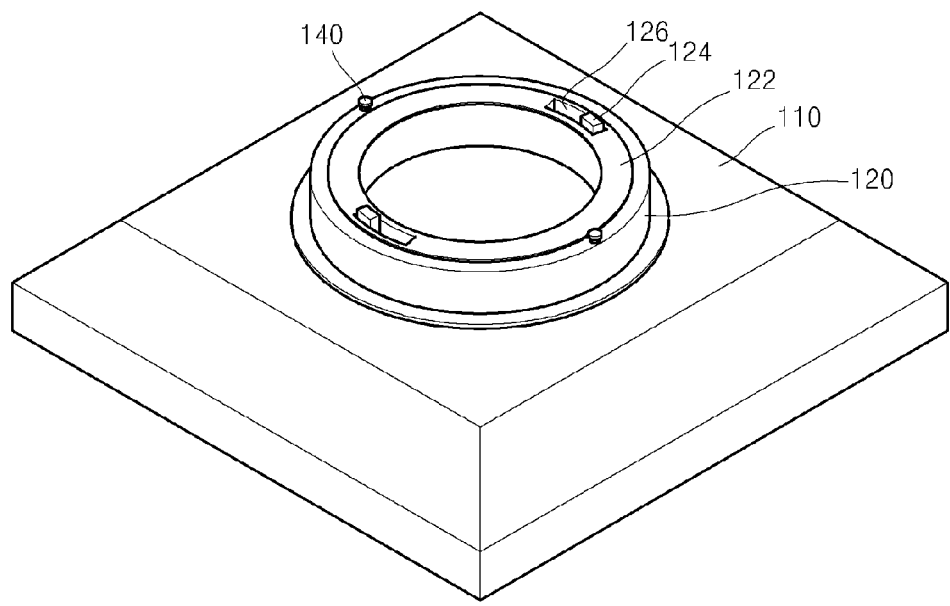
FIG. 7 is a perspective view of the test head of FIG. 4 from which a ZIF ring is removed.

FIG. 7 is a perspective view of the test head 100 of FIG. 6 from which the ZIF ring 130 is removed. In FIG. 7, the test head 100 is turned over for clarity.

Referring to FIG. 7, a guard ring 122 with which the ZIF ring 130 may be coupled may be provided on the bottom surface of the base 120, and a rotation coupling unit 124 configured to rotate the ZIF ring 130 may be installed on the guard ring 122.

The rotation coupling unit 124 may protrude from a top surface of the guard ring 122. When the ZIF ring 130 is coupled with the guard ring 122, the rotation coupling unit 124 may be fixedly inserted into a groove formed in the ZIF ring 130. Also, after being coupled with the ZIF ring 130, the rotation coupling unit 124 may rotate along a rotation groove 126 and lead the ZIF ring 130 to rotate. The rotation coupling unit 124 may be rotated by a rotation driving unit (not shown) disposed within the base 120.

In the present embodiment, the rotation coupling unit 124 is only an example. Accordingly, various structures of rotation coupling units capable of rotating the ZIF ring 130 may be employed. For example, any rotation coupling unit configured to apply rotary power to a lateral surface of the ZIF ring 130 to rotate the ZIF ring 130 may be adopted.

Figure 8:
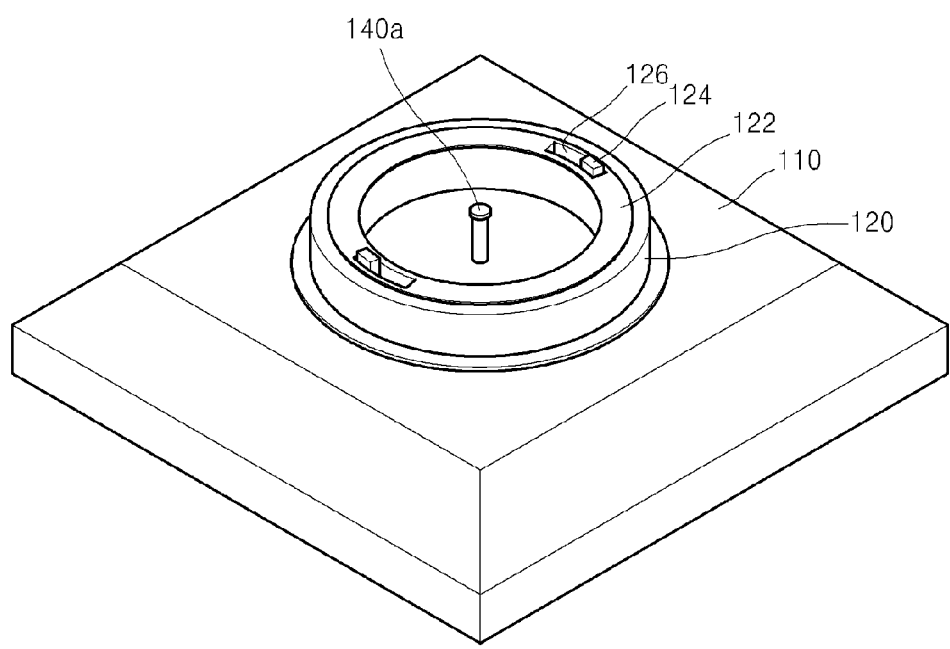
FIG. 8 is a perspective view of a modified example of FIG. 5 in which a suspender is formed in a central portion of a base.

FIG. 8 is a perspective view of a modified example of FIG. 7 in which a suspender 140a is formed in a central portion of the base 120.

Referring to FIG. 8, in the present embodiment, the suspender 140a may be disposed in the central portion of a hollow of the base 120. In the present embodiment, the suspender 140a may function in the same manner as described with reference to FIG. 4. Specifically, the suspender 140a may ZIF-couple the probe card 300 with the ZIF ring 130 during a wafer test operation, and couple the probe card 300 apart with the ZIF ring 130 during the rotation of the ZIF ring 130 such that the probe card 300 remains spaced a predetermined distance apart from the bottom surface of the base 120. When the suspender 140a is formed at the center of the base 120, a suspender coupling unit 312 corresponding to the probe card 300 may be disposed in the center of a top surface of the probe card 300.

As mentioned above, alternatively, a ZIF coupler may be used instead of the ZIF ring 130. In one embodiment, the ZIF coupler, the base 120, and the probe card 300 may be formed in another shape, such as a rectangle or square, or any other shape suitable to encompass a wafer or identically split regions of a wafer. In these alternative embodiments, the ZIF coupler may move to enable the probe card 300 to perform a one-touch operation on the wafer W and test all the semiconductor devices 1 disposed on the wafer W. In these alternative embodiments, the ZIF coupler may move in a linear fashion over the wafer. That is, the ZIF coupler may move horizontally and/or vertically across the wafer W while performing a one-touch operation on the wafer W to test all the semiconductor devices disposed thereon. In one embodiment, a movable coupling unit may be configured to apply power to a lateral surface of the ZIF coupler in order to move the ZIF coupler in a linear manner. In the alternative embodiments in which a ZIF coupler is used in lieu of a ZIF ring 130, the test apparatus 1000 carries out a one-touch operation for testing the semiconductor devices on a wafer in a similar manner, changing only the shape of the ZIF coupler, the base 120 and the probe card 300 and the type of movement the ZIF coupler undergoes. The features and embodiments described with respect to a test apparatus 1000 that uses a ZIF ring 130 are equally applicable and usable with a test apparatus 1000 that uses a ZIF coupler.

Figure 9:
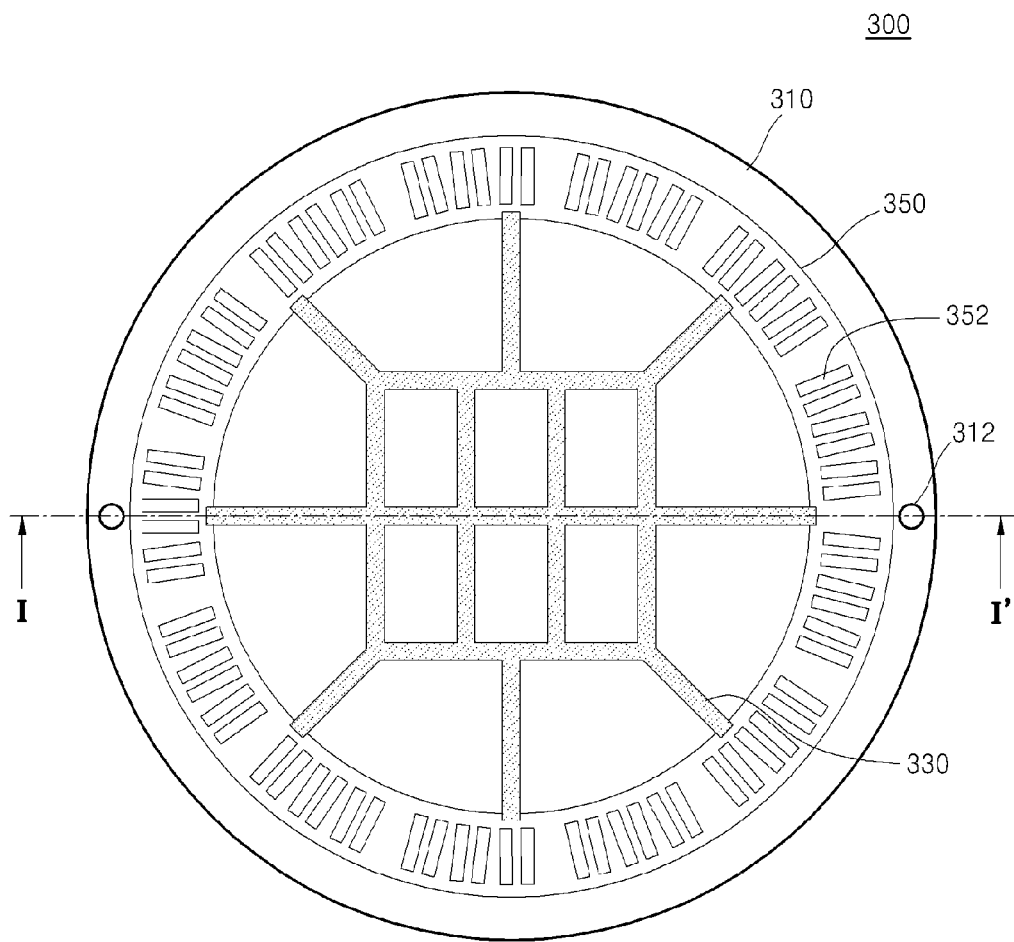
FIG. 9 is a plan view illustrating a top surface of a probe card coupled with the test head of FIG. 4.
Figure 10:
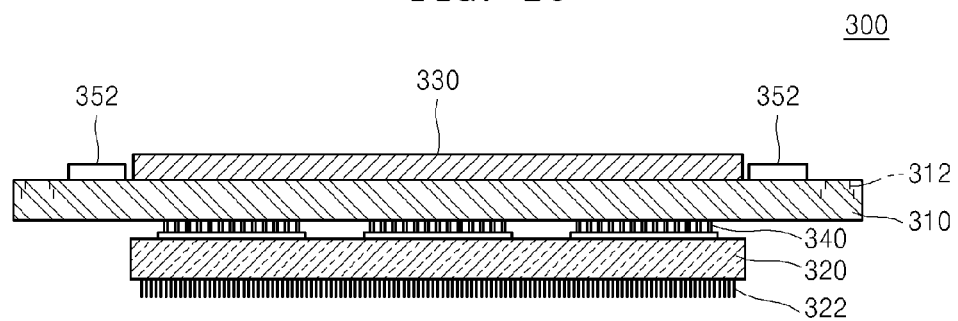
FIG. 10 is a cross-sectional view of the probe card, which is taken along a line I-I' of FIG. 9.

FIG. 9 is a plan view illustrating a top surface of the probe card 300 coupled with the test head 100 of FIG. 6, and FIG. 10 is a cross-sectional view of the probe card 300, which is taken along a line I-I' of FIG. 9.

Referring to FIGS. 9 and 10, the probe card 300 may include a main circuit board 310, a needle block 320, a reinforcing member 330, an interposer 340, and a connector unit 350.

The main circuit board 310 may correspond to a main body of the probe card 300 and include a plurality of interconnections (not shown). The interposer 340 and the connector unit 350 may be electrically connected to each other by the interconnections of the main circuit board 310. Also, a suspender coupling unit 312 may be formed on a terminal of an outer portion of the top surface of the main circuit board 310 to couple the main circuit board 310 with the suspender 140. When the suspender 140 is formed in the center of the base 120, the suspender coupling unit 312 may be formed in the center of the probe card 300.

A plurality of probe needles 322 may be disposed on the needle block 320. The probe needles 322 may physically and electrically contact with electrode pads of respective semiconductor devices during a test of the semiconductor devices. The needle block 320 may physically and electrically couple with the main circuit board 310 through the interposer 340. A signal channel may connect a set of the probe needles 322 to a subset of male connectors 352 of the probe card 300. One or more signal channels may be used to connect all of the probe needles 322 to all of the subsets of male connectors 352.

The needle block 320 according to the present embodiment may have such a size as to cover the entire wafer to test all of the semiconductor devices of the wafer via a one-touch operation. Alternatively, the needle block 320 may have such a size as to cover one of several regions of semiconductor devices on the wafer via a one-touch operation. In some embodiments, the needle block 320 has such a size as to cover one of several identically split regions of the wafer via a one-touch operation.

In the embodiments in which the needle block 320 has a size to cover only a region of the wafer, that region of the wafer may remain connected to the probe card while the one-touch operation of testing all of the semiconductor devices in the connected region is performed. To that end, the region of the wafer may remain connected while the female connectors 132 of the ZIF ring 130 couple with a subset of male connectors 352 of the probe card and the ZIF ring 130 subsequently rotates to enable the coupling of the female connectors 132 with another subset of male connectors 352 until all of the male connectors 352 have been coupled with one female connector 132 and an electric signal has been sent and received during each coupling by the test main body 400. Thus, the region of the wafer may remain connected to the probe card until all of the semiconductor devices in that region are tested. In these embodiments, after each of the semiconductor devices in the connected region are tested, the probe card would disconnect from that region of the wafer and connect to another region of the wafer for testing, until all of the regions of the wafer (and thus all of the semiconductor devices on the wafer) were tested.

In one embodiment, the reinforcing member 330 of the probe card 300 may be disposed on the top surface of the main circuit board 310. The reinforcing member 330 may function to support the main circuit board 310 and prevent deformation (e.g., warpage or distortion) of the main circuit board 310. In the present embodiment, the reinforcing member 330 may have a lattice shape, but the shape of the reinforcing member 330 is not limited thereto and the reinforcing member 330 may have various shapes so as to support the main circuit board 310.

The connector unit 350 may include a plurality of male connectors 352 and may be formed in a pattern that corresponds to the pattern of the female connectors 132 on the ZIF ring 130. In one embodiment, the male connectors 352 may be formed in a ring form on the top surface of the main circuit board 310 along a circumferential direction. In another embodiment, where a ZIF coupler is used in lieu of a ZIF ring 130, the male connectors 352 may be spaced evenly in rows and/or columns on the connector unit 350. The arrangement of the male connectors 352 is not limited to those embodiments described herein.

As mentioned above, the ratio of male connectors 352 to female connectors 132 determines how many rotations of the ZIF ring 130 are needed to test all of the semiconductor devices on a wafer. In one embodiment, the male connectors 352 of the connector unit 350 may include three subsets of male connectors comprising pairs of the male connectors in a number equal to three-fold the number of pairs of female connectors of the ZIF ring 130 because the wafer is divided into three test regions and three signal channels exist between the needle block 320 and the male connectors 352 of the probe card 300 that correspond to the three test regions. When the number of signal channels is changed and the wafer is divided into a different number of test regions corresponding to the number of signal channels, the number of subsets of male connectors 352 of the connector unit 350 may be changed.

As described above, the pairs of female connectors of the ZIF ring 130 may be ZIF-coupled with a subset of pairs of male connectors 352 of the connector unit 350. All the probe needles 322 of the needle block 320 connected to the subset of coupled pairs of male connectors 352 may be electrically connected to the female connectors 312 of the ZIF ring 130. The probe needles 322 of the needle block 320 may be electrically connected to the subset of connectors 352 of the connector unit 350 by internal interconnections of the needle block 320, the interposer 340, and internal interconnections of the main circuit board 310. In one embodiment where there are three pairs of male connectors for each female connector, by rotating the ZIF ring 130 twice, the pairs of female connectors of the ZIF ring 130 may be ZIF-coupled with all the pairs of male connectors 352 in all of the subsets of male connectors 352 of the connector unit 350 once each time.

As mentioned above, when the ZIF ring 130 has male connectors, the connector unit 350 may have female connectors. When the ZIF ring 130 has connectors with other structures than female or male connectors, the connector unit 350 may have connectors with other structures.

In the present embodiment, the probe card 300 is only an example. Thus, the test apparatus 1000 according to the present embodiment may adopt various structures of probe cards. That is, the test apparatus 1000 according to the present embodiment may adopt any probe card capable of being coupled with a rotary ZIF ring 130 or other type or shape of ZIF coupler.

Figure 11:
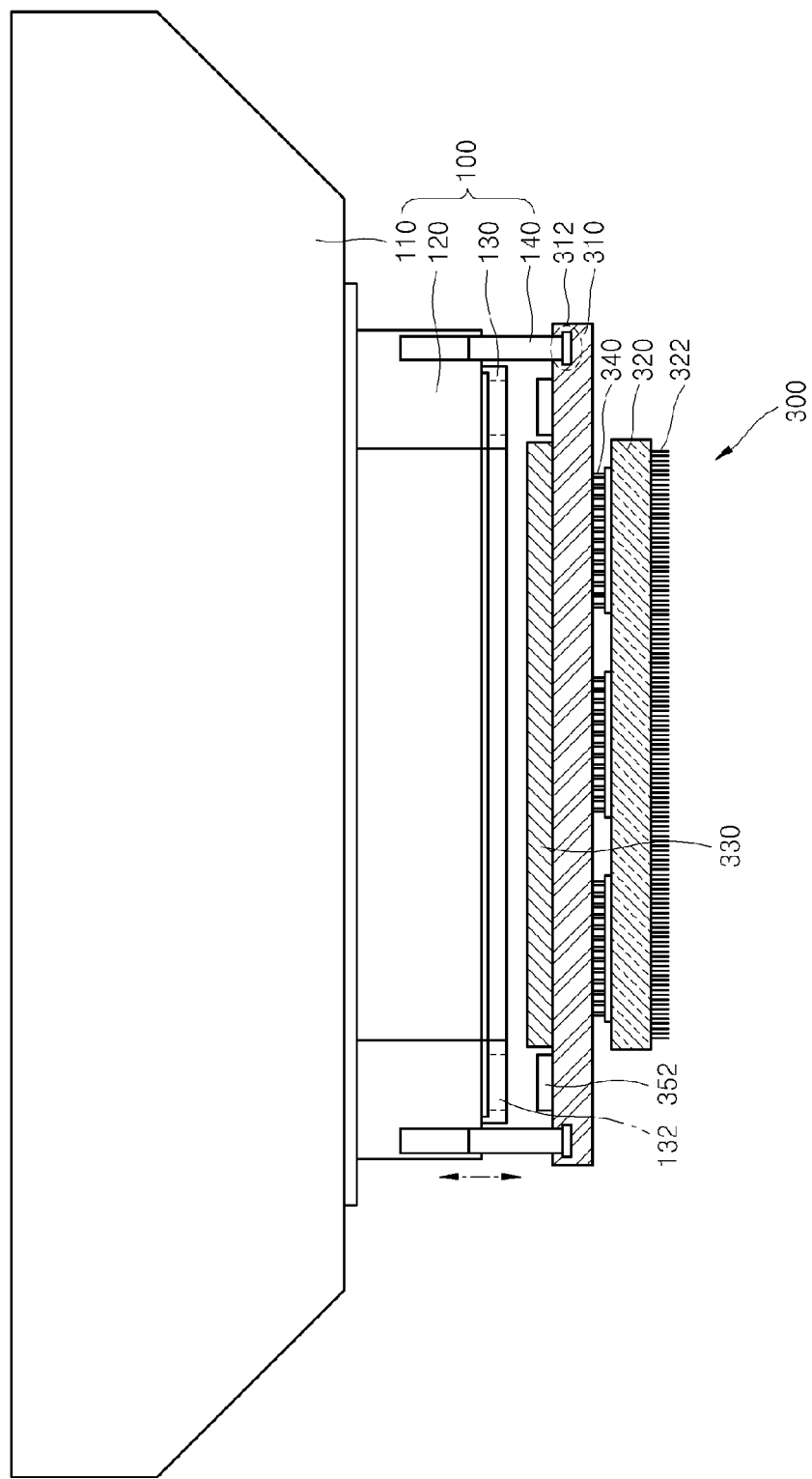
FIG. 11 is a cross-sectional view of the test head of FIG. 6, which is remotely coupled with a probe card.

FIG. 11 is a cross-sectional view of the test head 100 of FIG. 6, which is coupled apart with the probe card 300.

Referring to FIG. 11, the probe card 300 may be physically coupled with the base 120 of the test head 100 by the suspender 140. That is, the suspender 140 may be coupled with the suspender coupling unit 312 of the probe card 300 so that the probe card 300 can be physically coupled with the base 120. As described above, the suspender 140 may function to couple the probe card 300 with the base 120 to enable ZIF-coupling of the probe card 300 with the ZIF ring 130 during the test of a wafer, and to space the probe card 300 apart from the base 120 to maintain a predetermined distance between the probe card 300 and the bottom surface of the base 120 during the rotation of the ZIF ring 130.

FIG. 11 illustrates the probe card 300 coupled apart with the base 120. After the ZIF ring 130 rotates, to perform a subsequent test of a next, untested subset of semiconductor devices on the wafer, the suspender 140 may be moved upward and closely contacted with the base 120. As a result, a subset of the male connectors 352 of the connector unit may be ZIF-coupled with the female connectors 132 of the ZIF ring 130.

Also, when the entire wafer is completely tested, coupling of the probe card 300 with the ZIF ring 130 through the suspender 140 may be released so that the probe card 300 can be separated from the test head 100. Thus, the one-touch test of all the semiconductor devices on the wafer is completed.

FIGS. 12(a) through (c) are conceptual diagrams illustrating a process of sequentially coupling the probe card 300 due to rotation of the ZIF ring 130 according to one embodiment of the invention in which there are three pairs of male connectors 352 on the probe card 300 for each pair of female connectors 132 on the ZIF ring 130.

Figure 12:
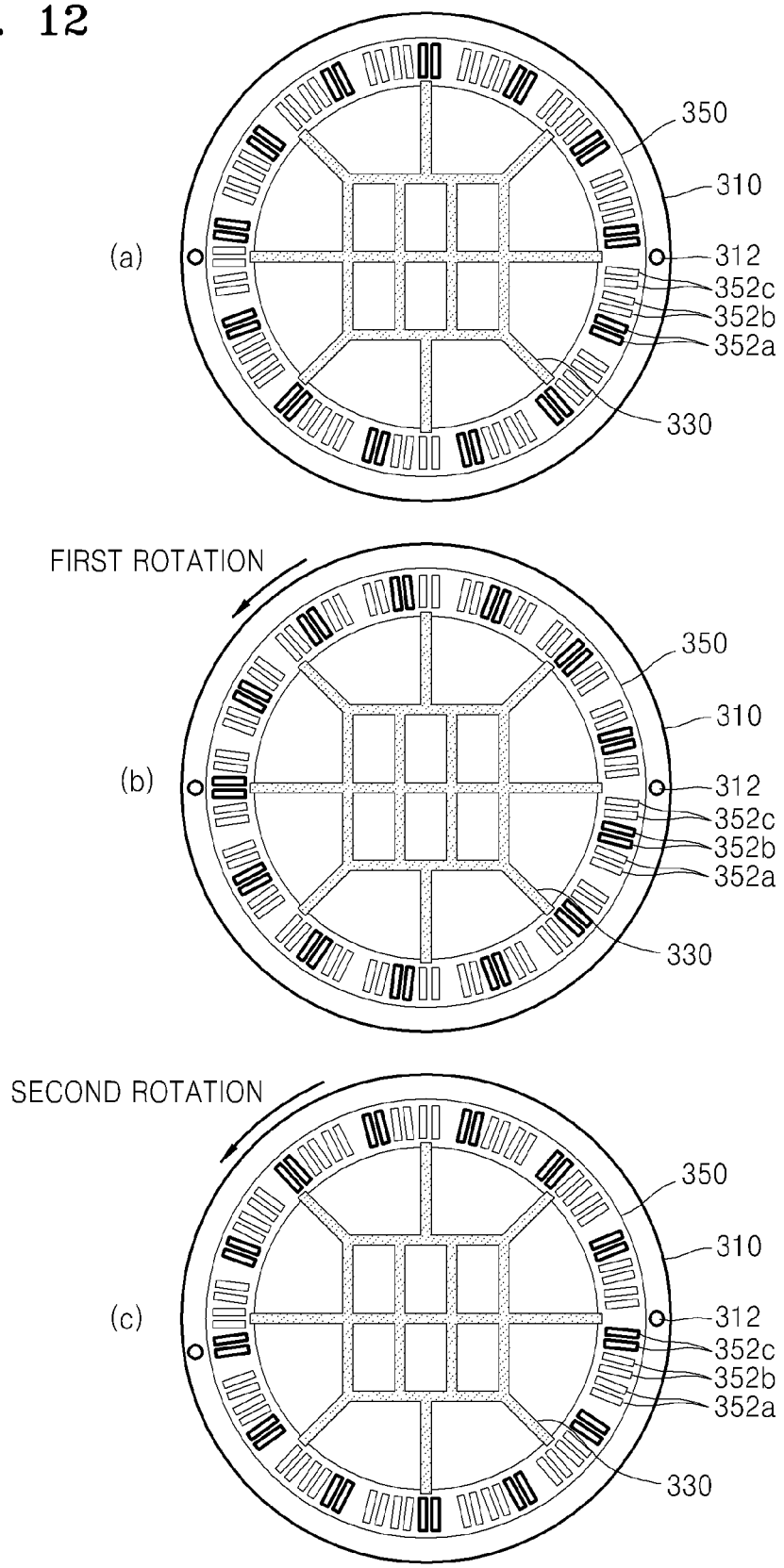
FIGS. 12(a) through (c) are conceptual diagrams illustrating a process of sequentially coupling a probe card due to rotation of a ZIF ring.

Referring to FIG. 12, a first subset of pairs of connectors 352a of the pairs of male connectors 352 of the connector unit 350 of the probe card 300 may be coupled with the female connectors 132 of the ZIF ring 130. The first subset of pairs of coupled connectors 352a is illustrated with bold lines. This first subset of pairs 352a is connected to a first set of probe needles 322a (not shown) through a first signal channel (not shown). The semiconductor devices connected to the first set of probe needles 322a may be tested.

Next, the probe card 300 may be spaced apart from the ZIF ring 130. After the ZIF ring 130 rotates for the first time, a second subset of pairs of connectors 352b of the pairs of male connectors 352 of the connector unit 350 may be coupled with the female connectors 132 of the ZIF ring 130. Similarly, the second subset of pairs of coupled connectors 352b is illustrated with bold lines. This second subset of connectors 352b are connected with a second set of probe needles 322b through a second signal channel. The semiconductor devices connected to the second set of probe needles 322b may be tested.

Once more, the probe card 300 may be spaced apart from the ZIF ring 130. After the ZIF ring 130 rotates again, a third subset of pairs of connectors 352c of the pairs of male connectors 352 may be coupled with the female connectors 132 of the ZIF ring 130 again. Similarly, the third subset of pairs of connectors 352c is illustrated with bold lines. This third subset of connectors 352c are connected with a third set of probe needles 322c through a second signal channel. The semiconductor devices connected to the third set of probe needles 322b may be tested.

Thus, by rotating the ZIF ring 130 twice, the pairs of female connectors 132 of the ZIF ring 130 may be coupled with all the pairs of male connectors 352 of the connector unit 350 of the probe card 300 once. Thus, all of the semiconductor devices of the wafer may be tested via a one-touch operation by the repeated connection of the female connectors 132 to different sets of male connectors 352 that are respectively connected via the probe needles 322 to the wafer. That is, when the probe card 300 is touched by the wafer, the probe card and the wafer remain coupled such that a touch state may be maintained until the test of all of the semiconductor devices of the wafer is finished.

Figure 13:
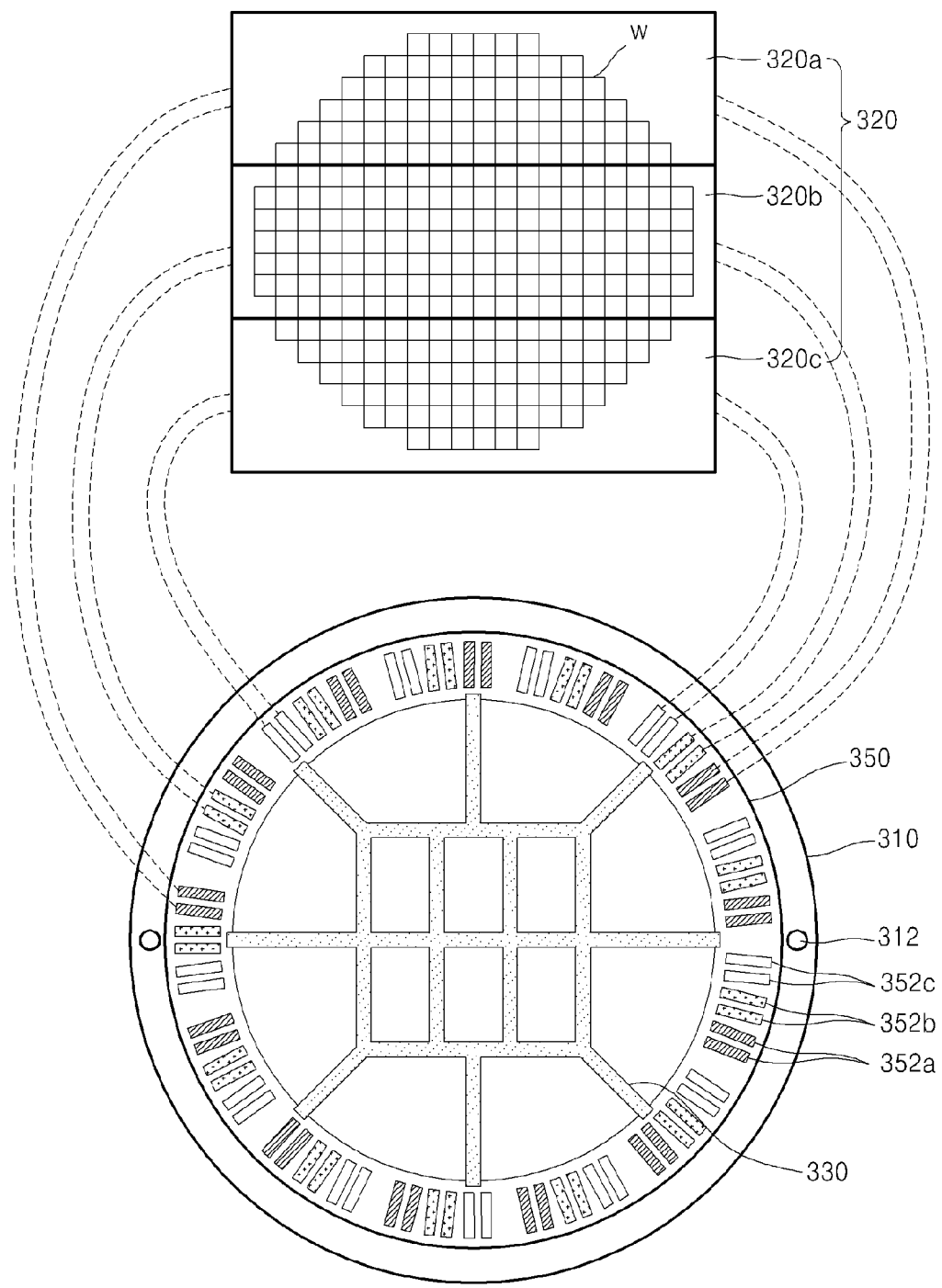
FIG. 13 is a conceptual diagram showing a relationship of signal signals connected between connectors of a connector unit of the probe card of FIG. 10 and a needle block.

FIG. 13 is a conceptual diagram showing a relationship of signals connected between connectors 352 of a connector unit 350 of the probe card 300 of FIG. 10 and the needle block 320. For brevity, FIG. 13 illustrates that the needle block 320 is disposed at a lower portion of the probe card 300 and protrudes from the probe card 300, and the wafer covered with the needle block 320 is disposed within the needle block 320.

Referring to FIG. 13, as described above, male connectors 352 of the connector unit 350 of the probe card 300 may be disposed in pairs and classified into a discrete amount of subsets of pairs of connectors corresponding to the amount of signal channels between the male connectors 352 and the needle block 320 of the probe card 300. In the embodiment depicted in FIG. 13, the male connectors 352 are disposed in pairs and classified into three subsets of pairs of connectors corresponding to the three signal channels depicted in the Figure. The number of signals between the connectors 352 and the needle block 320 is not limited to three, nor is the ratio of male to female connectors limited to three. The number of signal channels, and, correspondingly, the ratio of male to female connectors, can be any number suitable for use.

In the embodiment depicted in FIG. 13, the wafer may be divided into three test regions corresponding to the three signal channels between the needle block 320 and the male connectors 352 of the probe card 300. The needle block 320 may be classified into first through third block regions 320a, 320b, and 320c according to the divided three test regions.

The first subset of pairs of connectors 352a of the connector unit 350 corresponding to the first signal channel may be electrically connected to probe needles of the first block region 320a, the second subset of pairs of connectors 352b of the connector unit 350 corresponding to the second signal channel may be electrically connected to probe needles of the second block region 320b, and the third subset of pairs of connectors 352c of the connector unit 350 corresponding to the third signal channel may be electrically connected to probe needles of the third block region 320c.

Based on the above-described signal-channel connecting relationship, the test apparatus 1000 of the present embodiment may sequentially couple the female connectors 132 of the ZIF ring 130 with the first through third subsets of pairs of connectors 352a, 352b, and 352c of the connector unit 350, which may be facilitated by the rotation of the ZIF ring 130. Thus, all the semiconductor devices of the three test regions of the wafer corresponding to the first through third block regions 320a, 320b, and 320c may be sequentially tested.

In the present embodiment, although the wafer and the needle block 320 are horizontally divided into several regions, the regions are not limited to those depicted or described herein; rather, the wafer and the needle block 320 may be divided into regions of various shapes. Also, the number of divided regions and the number of pairs of connectors of the connector unit 350 may vary according to the number of signal channels between the needle block 320 and the male connectors 352 of the probe card 300.

Figure 14A:
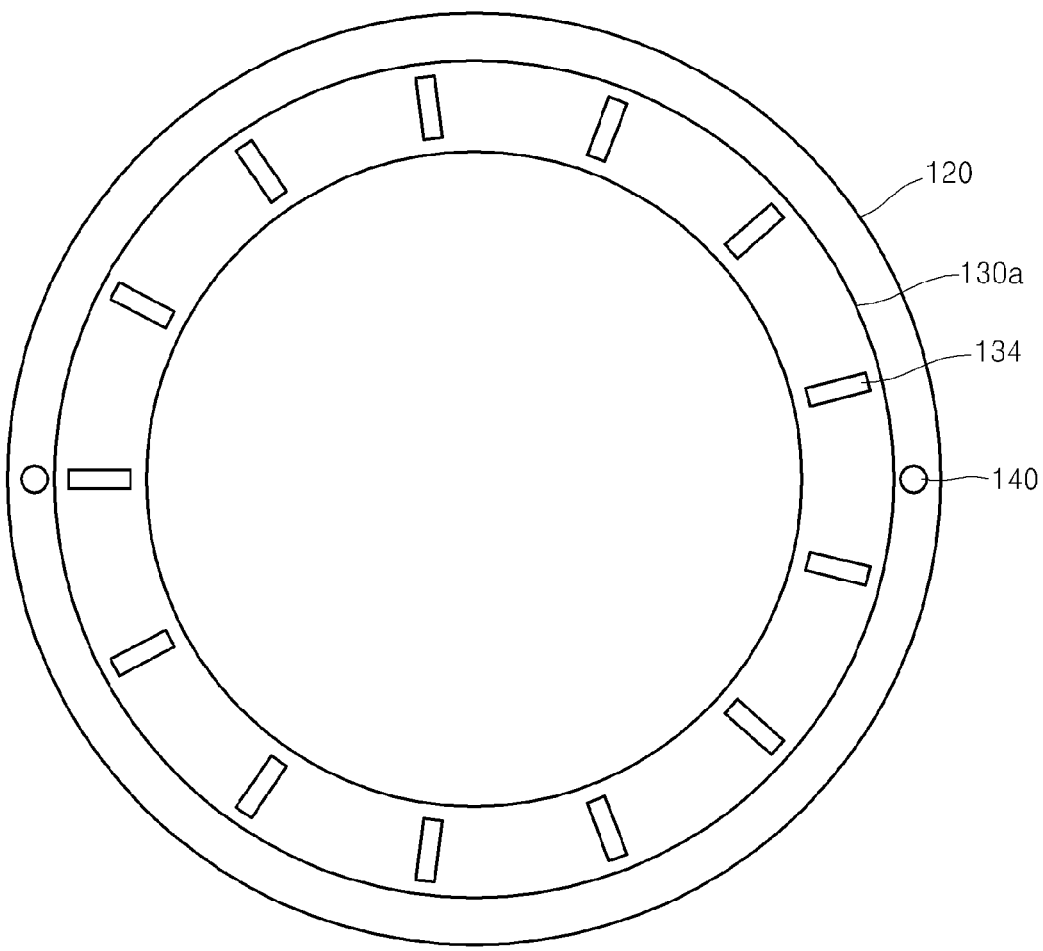
FIGS. 14A and 14B are plan views of a connector unit of a ZIF ring and a probe card in a test apparatus according to another exemplary embodiment.
Figure 14B:
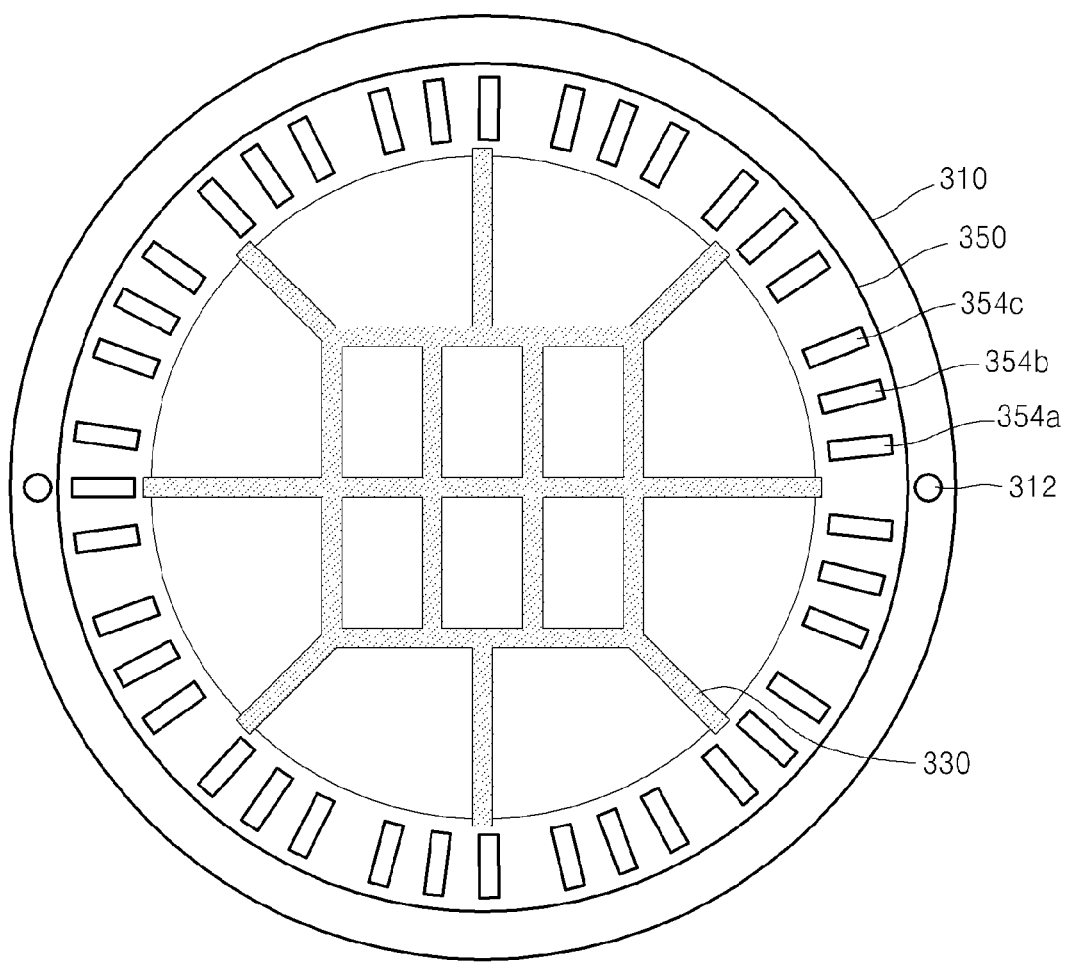

FIGS. 14A and 14B are plan views of a connecting structure of a ZIF ring 130 and a probe card 300 in a test apparatus 1000 according to another exemplary embodiment.

Referring to FIGS. 14A and 14B, unlike the ZIF ring 130 shown in FIG. 6, the ZIF ring 130 of FIG. 14A may include not pairs of female connectors 132 but discrete female connectors 134. Also, the connector unit 350 of the probe card 300 may include discrete male connectors 354 corresponding to the female connectors 134. In one embodiment, the probe card 300 may include three subsets of discrete male connectors 354a, 354b, and 354c.

Although the present embodiment describes separately formed female and male connectors, the form of the male and female connectors is not limited thereto; for example, at least three pairs of female and male connectors may be adopted. Also, the connectors of the ZIF ring 130 are formed on the entire ZIF ring 130 along a circumferential direction and the connectors of the connector unit 350 have adjacent structures corresponding to the connectors of the ZIF ring 130; however, the structures and positions of the connectors are not limited thereto, and the female and male connectors may have different structures and positions on the ZIF ring 130 and connector unit 350 respectively.

For example, the connectors of the ZIF ring 130 may be formed only in a specific region; the connectors of the connector unit 350 corresponding to the first through third signal channels may be respectively formed in divided regions. That is, in one embodiment, signals may be formed respectively in a region ranging from 0 to 120°, a region ranging from 120 to 240°, and a region ranging from 240 to 360°, and the ZIF ring 130 may be configured to rotate by about 120° at one time and to couple with the connectors of each of the first through third signal channels. Alternatively, in one of the embodiments in which a ZIF coupler is used in lieu of a ZIF ring 130 and three signal channels exist between the needle block 320 and the connectors 352, a first signal channel may correspond to a first subset of three sets of rows of male connectors, a second signal channel may correspond to a second subset of rows of male connectors, and a third signal channel may correspond to a third subset of rows of male connectors.

Figure 15:
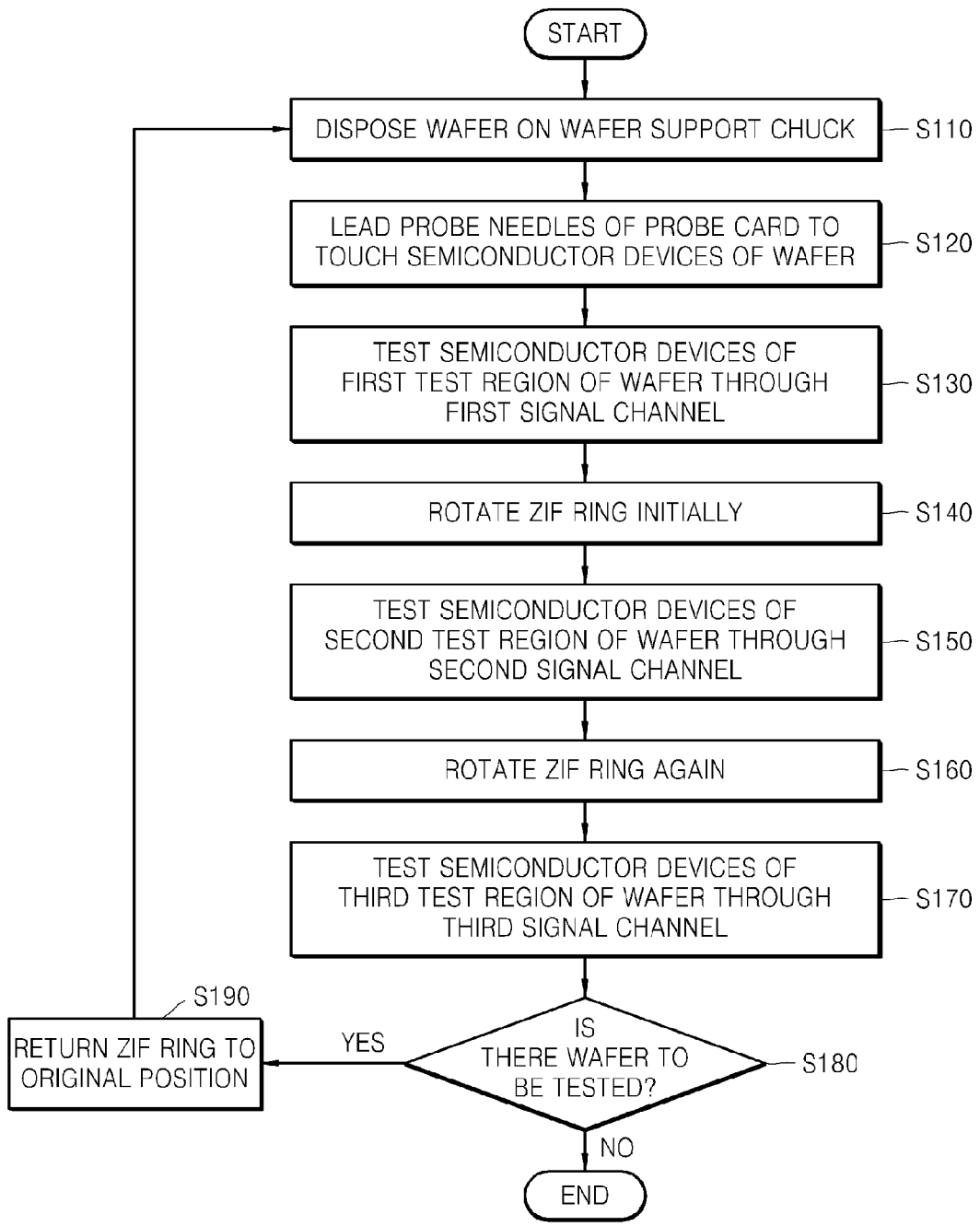
FIG. 15 is a flowchart illustrating a method of testing a semiconductor device, according to another exemplary embodiment.

FIG. 15 is a flowchart illustrating a method of testing a semiconductor device, according to an exemplary embodiment in which three signals channels exist between the needle block 320 and the male connectors 352 on the probe card 300. For brevity, the flowchart of FIG. 15 will be described with reference to FIG. 5.

Referring to FIG. 15, a wafer W to be tested may be transferred from the loader chamber 500 and disposed on the wafer support chuck 220 of the test chamber 200 (operation S110). Here, the wafer support chuck 220 may function to simply move the wafer W upward and downward, and an alignment unit (not shown) may be prepared on a top surface of the wafer support chuck 200 such that the wafer W is located in a precise position.

Next, the probe needles 322 of the probe card 300 may touch all of the semiconductor devices of the wafer W (operation S120). The semiconductor devices of the wafer W may be touched by the probe needles 322 of the probe card 300 by moving the wafer support chuck 220 upward. Also, before the probe needles 322 of the probe card 300 touch the semiconductor devices, the probe card 300 may be ZIF-coupled with the ZIF ring 130 of the test head 100 and disposed in an upper open region of the test chamber 200. Alternatively, the probe card 300 may be ZIF-coupled with the ZIF ring 130 after the probe needles 322 of the probe card 300 touch the semiconductor devices.

After the probe needles 322 of the probe card 300 touch the semiconductor devices, semiconductor devices disposed on a first region of the wafer W may be tested through the first signal channel (operation S130). As described above, to test the semiconductor devices on the wafer, an electric signal for testing the semiconductor devices may be generated by the test main body 400 and applied through the test head 100 and the probe card 300 to the semiconductor devices of the wafer W. In one embodiment, the electric signal is transmitted from the test main body 400 through the first signal channel to those semiconductor devices connected to the probe needles 322 associated with the first signal channel (the semiconductors disposed on the first region of the wafer).

When the test of the semiconductor devices disposed on the first region of the wafer W is finished, the ZIF ring 130 may be rotated (operation S140). The first rotation of the ZIF ring 130 may be performed while the probe card 300 is being coupled apart with the ZIF ring 130. Alternatively, the first rotation of the ZIF ring 130 may be performed while the probe card 300 is released from coupling with the ZIF ring 130. After the ZIF ring 130 is rotated, the probe card 300 may be ZIF-coupled with the ZIF ring 130 through use of the suspender 140.

After the first rotation of the ZIF ring 130, the semiconductor devices disposed on a second region of the wafer W may be tested through the second signal channel (operation S150) in a manner similar to the testing of the semiconductor devices in the first region of the wafer.

When the test of the semiconductor devices disposed on the second region of the wafer W is finished, the ZIF ring 130 may be rotated again (operation S160). The second rotation of the ZIF 130 may be done in a manner similar to the first rotation of the ZIF ring 130.

After the second rotation of the ZIF ring 130, the semiconductor devices disposed on a third region of the wafer W may be tested through the third signal channel in a manner similar to the testing of the semiconductor devices in the first and second regions of the wafer (operation S170). When the test of the semiconductor devices disposed on the third region of the wafer W is finished, the test of all the semiconductor devices of one wafer W may be ended and the one-touch operation of testing all the semiconductor devices may be complete.

That is, as described with reference to FIG. 13, a method of testing a semiconductor device according to the present embodiment may be performed on the assumption that three signal channels are prepared and the wafer is divided into three test regions. Accordingly, when a different number of signal channels are prepared and the wafer is divided into a different number of test regions, a test process may be changed. However, even if the numbers of the signal channels and the test regions of the wafer are changed, the test of all the regions of the wafer may be performed using the rotation of the ZIF ring 130. Alternatively, in an embodiment where a ZIF coupler is used in lieu of the ZIF ring 130, the test of all of the regions of semiconductor devices of the wafer may be performed using the movement of the ZIF coupler.

Also, a touch state of the probe card 300 with the wafer W may be continuously maintained from a time point when the semiconductor devices disposed on the first region of the wafer W are tested to a time point when the semiconductor devices disposed on the last remaining untested region of the wafer W are tested. That is, the test of the semiconductor devices disposed on all the regions of the wafer W may be completed via a one-touch operation with the wafer in continuous and uninterrupted contact with the probe card 300, unlike in the conventional case where a test process requires several touch operations.

When the test of one wafer is finished, it may be determined whether there is another wafer to be tested (operation S180). If there is a wafer to be tested, the ZIF ring 130 may be rotated in a reverse manner (operation S190). That is, the ZIF ring 130 may be rotated in a reverse direction until it is restored to an original position. Alternatively, the ring may continue to be rotated in the same direction until it reaches its original position. After the reverse rotation of the ZIF ring 130, the test method may enter a wafer disposition operation (S110) so that the test of other wafers can be continuously performed.

Also, the reverse rotation (S190) of the ZIF ring 130 may be omitted, the test method may enter the wafer disposition operation (S110) to test the wafer W, and the wafer W may be tested by rotating the ZIF ring 130 in a reverse direction once each time.

Otherwise, in operation S180, if there is no wafer to be tested (when the test of all the wafers is finished), the test process may be ended. After the test process is ended, the probe card 300 may be separated from the test head 100.

Figure 16:
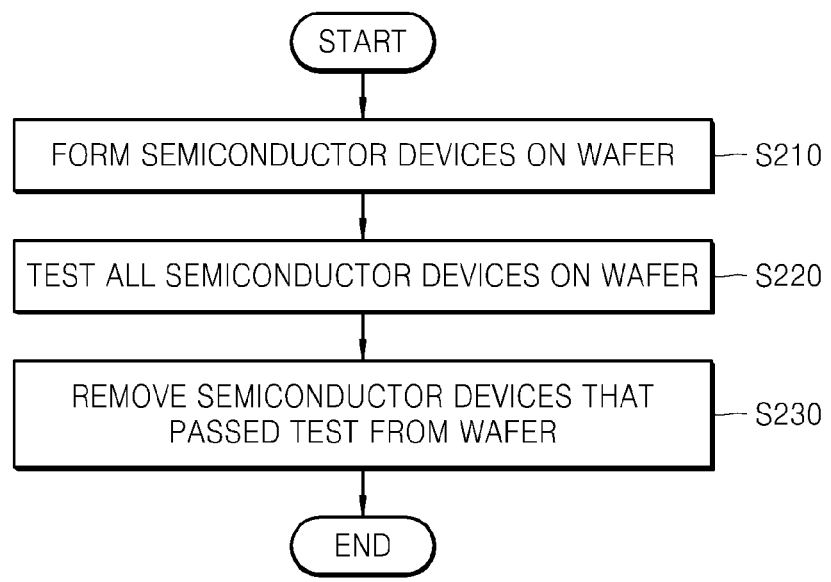
FIG. 16 is a flowchart illustrating a method of testing a semiconductor device, according to still another exemplary embodiment.

Next, a method of manufacturing a semiconductor device using the test apparatus 1000 as described in FIGS. 1-14 with a ZIF coupler will be discussed in connection with FIG. 16. FIG. 16 depicts an exemplary method of manufacturing a semiconductor device in accordance with certain embodiments. The semiconductor device may be, for example, a semiconductor package, or a system, including a semiconductor package connected to a circuit board or other substrate. For example, the semiconductor device could be part of a semiconductor memory module, a memory card, a controller, or other component of an electronic device. The semiconductor device could be used in a system such as a cell phone, a PDA, a laptop computer, a removable memory, a personal media player, etc.

In step s210, a plurality of semiconductor devices are formed on a wafer. The necessary processes for forming the semiconductor devices, such as doping or ion implantation, etching, and so forth, are completed such that a plurality of semiconductor devices are formed on a wafer with scribe lines separating the devices. In one embodiment, the wafer may be a wafer W such as described above in connection with FIGS. 1 and 2.

Next, the wafer is tested in step s220. In one embodiment, the testing would be similar to that depicted via the flowchart of FIG. 15. Thus, the wafer would be transferred from the loader chamber 500 and placed on the wafer support chuck 220. Next, the probe needles 322 of the probe card 300 may touch all of the semiconductor devices of the wafer. Before or after the probe needles 322 of the probe card touch all of the semiconductor devices of the wafer, the probe card 300 may be ZIF-coupled with the ZIF coupler of the test head 100.

After the probe needles 322 touch the semiconductor devices, the semiconductor devices disposed on a first region of the wafer may be tested through the first signal channel operation in a manner similar to the testing undertaken in S130 of FIG. 15. The number of regions of the wafer corresponds to the number of signal channels connecting the probe needles 322 to the semiconductor devices. An electric signal for testing the semiconductor devices may be generated by the test main body 400 and applied through the test head 100 and the probe card 300 to the connected semiconductor devices of the wafer. When the test head receives an output signal based on the electric signal sent to the semiconductor device from each of the semiconductor devices in that region, the test of the semiconductor devices of that region is finished. When all of the semiconductor devices in one region of the wafer have been tested, the ZIF coupler and the probe card 300 are coupled apart.

If there are any regions remaining on the wafer that have not been tested, the ZIF coupler is released from coupling with the probe card 300, the ZIF coupler is moved, and then is re-coupled to the probe card. An electric signal for testing is again generated by the test main body 400 and the semiconductor devices in that region are tested. The process of testing, uncoupling, moving, and re-coupling the ZIF coupler and probe card 300 is repeated until all of the semiconductor devices in all of the regions of the wafer have been tested. The one-touch operation of testing all of the semiconductor devices on the wafer may be complete. The wafer is then removed from the wafer support chuck 220.

As mentioned above, the shape and movement of the ZIF coupler is not limited to the depictions set forth herein, nor are the number of signal channels or wafer regions similarly limited.

In step s230, a further step in the manufacturing process of the semiconductor device is performed. In one embodiment, after all of the semiconductor devices in the wafer have been tested and the wafer is removed from the wafer support chuck 220, the semiconductor devices that have successfully passed the testing completed by the tester may be cut from the wafer and used. In one embodiment, a further step includes cleaning the wafer (and the semiconductor devices) before they are cut from the wafer. In one embodiment, a further step includes packaging the cut semiconductor devices.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:

1. A method for manufacturing a semiconductor device, comprising the steps of:

forming a plurality of semiconductor devices using a wafer as a substrate, each of the plurality of semiconductor devices including pads in electrical communication with integrated circuitry of the semiconductor devices;

contacting a plurality of probe needles disposed on a probe card to corresponding pads of the semiconductor devices;

connecting each of a plurality of tester electrical connectors disposed on a tester to a first set of probe card electrical connectors disposed on the probe card;

testing a first group of semiconductor devices connected to a first set of probe needles that are in electrical communication with the first set of probe card electrical connectors;

disconnecting the plurality of tester electrical connectors from the first set of probe card electrical connectors;

while the plurality of probe needles remain in contact with the corresponding pads of the semiconductor devices, connecting the plurality of tester electrical connectors to a second set of probe card electrical connectors;

testing a second group of semiconductor devices connected to a second set of probe needles that are in electrical communication with the second set of probe card electrical connectors; and disconnecting the wafer from the plurality of probe needles.

2. The method of claim 1, wherein the tester includes a zero insertion force (ZIF) coupler on which the tester electrical connectors are disposed and wherein the tester electrical connectors are connected to the probe card electrical connectors by the ZIF coupler.

3. The method of claim 1, wherein the tester includes a ring on which the tester electrical connectors are disposed, and further comprising the step of rotating the ring after disconnecting the plurality of tester electrical connectors from a first position with the plurality of tester electrical connectors aligned with first set of probe card electrical connectors to a second position with the plurality of tester electrical connectors aligned with the second set of probe card electrical connectors.

4. The method of claim 3, wherein the probe card includes N sets of probe card connectors, and the method further comprises the step of rotating the ring a predetermined number of times in order to connect each of the N sets of probe card connectors with the plurality of tester electrical connectors such that the plurality of tester electrical connectors are connected to only one of the N sets of probe card connectors at any one time.

5. The method of claim 2, wherein the ZIF coupler is a ZIF ring, and further comprising the step of rotating the ZIF ring after disconnecting the plurality of tester electrical connectors from a first position with the plurality of tester electrical connectors aligned with a first set of the probe card electrical connectors to a second position in order to align the tester electrical connectors with the second set of probe card electrical connectors.

6. The method of claim 1, wherein the tester includes a coupler on which the tester electrical connectors are disposed, and further comprising the step of moving the coupler in a linear manner after disconnecting the plurality of tester electrical connectors from a first position with the plurality of tester electrical connectors aligned with a first set of the probe card electrical connectors to a second position in order to align the tester electrical connectors with the second set of probe card electrical connectors.

7. The method of claim 1, further comprising one or more steps of:

determining which of the plurality of semiconductor devices on the wafer passed the test;

cutting one or more of the plurality of semiconductor devices from the wafer; and packaging the one or more of the semiconductor devices.

8. A tester, comprising:

a prober comprising:
  a plurality of probes; and
  a plurality of prober connectors, each of the prober connectors being in electrical communication with one or more probes, the plurality of probes being configured to contact corresponding pads of a plurality of semiconductor devices, the plurality of semiconductor devices using a wafer as a substrate;

a test head comprising:
  a plurality of tester connectors, and
  a coupling device configured to connect the plurality of tester connectors with a first subset of the plurality of prober connectors, the coupling device being configured to disconnect the plurality of tester connectors from the first subset of the plurality of prober connectors and to connect the plurality of tester connectors to a second subset of the plurality of prober connectors, and a test main body configured to test, via electrical communication with the tester connectors, a first subset of the semiconductor devices at a first time via the first subset of prober connectors and a second subset of the semiconductor devices at a second time via the second subset of prober connectors.

9. The tester of claim 8, wherein the tester is configured to test the first subset of semiconductor devices in parallel.

10. The tester of claim 8, wherein the coupling device is configured to disconnect the plurality of tester connectors from the first subset of the plurality of prober connectors and to connect the plurality of tester connectors to the second subset of the plurality of prober connectors while the probes remain connected to the plurality of semiconductor devices.

11. The tester of claim 8, wherein the coupling device is a zero-insertion-force (ZIF) coupler.

12. The tester of claim 8, wherein the tester is configured to use a one-touch operation to test each of plurality of semiconductor devices using the wafer as a substrate.

13. The tester of claim 8, wherein the coupling device is ring-shaped, and wherein the coupling device is configured to rotate from a first position with the plurality of tester connectors aligned with the first subset of prober connectors to a second position with the plurality of tester connectors aligned with the second subset of prober connectors.

14. The tester of claim 13, wherein the prober includes N subsets of probe card connectors, and the ring-shaped coupling device is configured to rotate a predetermined number of times in order to connect each of the N subsets of prober connectors with the plurality of tester connectors such that the plurality of tester connectors are connected to only one of the N subsets of probe connectors at any one time.

15. The tester of claim 11, wherein the ZIF coupler is a ZIF ring, and wherein the ZIF ring is configured to rotate from a first position with the plurality of tester connectors aligned with the first subset of the prober connectors to a second position in order to align the tester connectors with the second subset of prober connectors.

16. The tester of claim 8, wherein the coupling device is configured to move in a linear manner from a first position with the plurality of tester connectors aligned with the first subset of the prober connectors to a second position in order to align the tester electrical connectors with the second subset of prober connectors.

17. A semiconductor wafer testing system, comprising:
 a probing card comprising:
  a plurality of probing needles; and
  a plurality of probing card connectors, each of the probing card connectors being in electrical communication with one or more probing needles, the plurality of probing needles being configured to contact corresponding pads of a plurality of semiconductor devices, the plurality of semiconductor devices using a wafer as a substrate;
 a plurality of test connectors;
 a zero-insertion force (ZIF) ring configured to connect the plurality of test connectors with a first subset of the plurality of probing card connectors, the ZIF ring being configured to disconnect the plurality of test connectors from the first subset of probing card connectors and to connect the plurality of test connectors to a second subset of the plurality of probing card connectors, and
 a test main body configured to test, via electrical communication with the test connectors, a first subset of the semiconductor devices at a first time via the first subset of probing card connectors and a second subset of the semiconductor devices at a second time via a second subset of probing card connectors.

18. The testing system of claim 17, wherein the testing system is configured to use a one-touch operation to test each of plurality of semiconductor devices using the wafer as a substrate.

19. The testing system of claim 18, wherein the ZIF ring is configured to disconnect the plurality of test connectors from the first subset of the plurality of probing card connectors and to connect the plurality of test connectors to the second subset of the plurality of probing card connectors while the probing needles remain connected to the plurality of semiconductor devices.

20. The testing system of claim 17, wherein the probing card includes N subsets of probing card connectors, and the ZIF ring is configured to rotate a predetermined number of times in order to connect each of the N subsets of probing card connectors with the plurality of test connectors such that the plurality of test connectors are connected to only one of the N subsets of probing card connectors at any one time.

* * * * *